US010852858B2

(12) United States Patent
Paik et al.

(10) Patent No.: US 10,852,858 B2
(45) Date of Patent: Dec. 1, 2020

(54) COVER DEVICE, AND ELECTRONIC DEVICE AND METHOD FOR IDENTIFYING COVER DEVICE

(71) Applicant: Samsung Electronics Co., Ltd., Suwon-si (KR)

(72) Inventors: Su-Jin Paik, Anyang-si (KR); Joo-Hoan Do, Hwaseong-si (KR); Seong-Hoon Kang, Suwon-si (KR); Kum-Jong Sun, Suwon-si (KR); Tae-Hyeon Yu, Yongin-si (KR); Young-Oog Kim, Seongnam-si (KR); Yeong-Su Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/013,226

(22) Filed: Jun. 20, 2018

(65) Prior Publication Data

US 2019/0064885 A1 Feb. 28, 2019

(30) Foreign Application Priority Data

Aug. 22, 2017 (KR) ........................ 10-2017-0106284

(51) Int. Cl.
*G06F 3/039* (2013.01)
*G06F 1/16* (2006.01)
(Continued)

(52) U.S. Cl.
CPC .......... *G06F 3/0393* (2019.05); *G06F 1/1626* (2013.01); *G06F 1/1628* (2013.01);
(Continued)

(58) Field of Classification Search
CPC .... G06F 1/1628; G06F 1/1643; G06F 1/1671; G06F 1/1677; G06F 3/0393;
(Continued)

(56) References Cited

U.S. PATENT DOCUMENTS 5,887,995 A * 3/1999 Holehan ................. G06F 3/016
341/22
8,310,351 B2 * 11/2012 Krahenbuhl .......... G06F 3/0416
340/407.2

(Continued)

FOREIGN PATENT DOCUMENTS

EP 2 701 033 A1 2/2014
KR 10-2009-0098452 A 9/2009

(Continued)

OTHER PUBLICATIONS

Counterpart European Search Report dated Jun. 8, 2020, issued in European Patent Application No. 18847577.6.

*Primary Examiner* — Nidhi Thaker
(74) *Attorney, Agent, or Firm* — Jefferson IP Law, LLP

(57) ABSTRACT

An electronic device and method for identifying a detached cover device and a cover device therefor are provided. The electronic device includes a housing, a wireless communication circuit disposed within the housing, a touch screen display exposed to the exterior, and a processor disposed within the housing and electrically connected to the wireless communication circuit and the touch screen display. The processor may be configured to sense mounting of the cover device on the touch screen display, identify a conductor pattern of the mounted cover device by scanning the touch screen display on which the cover device is mounted, and identify the mounted cover device on the basis of the identified conductor pattern.

13 Claims, 18 Drawing Sheets

(51) Int. Cl.
*H04M 1/725* (2006.01)
*G06F 3/041* (2006.01)
*H04M 1/23* (2006.01)
*G06F 3/0488* (2013.01)
*H05K 5/02* (2006.01)
*H05K 5/03* (2006.01)

(52) U.S. Cl.
CPC .......... *G06F 1/1632* (2013.01); *G06F 1/1643* (2013.01); *G06F 1/1656* (2013.01); *G06F 1/1669* (2013.01); *G06F 1/1671* (2013.01); *G06F 1/1677* (2013.01); *G06F 3/04162* (2019.05); *G06F 3/04886* (2013.01); *H04M 1/23* (2013.01); *H04M 1/72527* (2013.01); *H04M 1/72575* (2013.01); *H05K 5/0247* (2013.01); *H05K 5/03* (2013.01); *G06F 2200/1634* (2013.01); *G06F 2203/04809* (2013.01); *H04M 2250/04* (2013.01); *H04M 2250/22* (2013.01)

(58) Field of Classification Search
CPC .............. G06F 1/1669; G06F 3/04886; H04M 1/72527; H04M 1/72575; H05K 5/03
See application file for complete search history.

(56) References Cited

U.S. PATENT DOCUMENTS

| | | | | |
|---|---|---|---|---|
| 8,416,065 B2* | 4/2013 | Pasquero | .......... | H04M 1/72594 340/407.2 |
| 8,421,761 B2* | 4/2013 | Natanzon | ............ | G06F 3/04842 345/173 |
| 9,559,740 B2* | 1/2017 | Lee | ....................... | H04B 1/3888 |
| 10,606,401 B2* | 3/2020 | Barel | ....................... | G06F 3/044 |
| 2003/0235452 A1* | 12/2003 | Kraus | .................. | B41J 5/102 400/472 |
| 2004/0248621 A1* | 12/2004 | Schon | ................. | G06F 3/04886 455/566 |
| 2006/0256090 A1* | 11/2006 | Huppi | ................. | A63F 13/2145 345/173 |
| 2007/0216655 A1* | 9/2007 | Chen | ..................... | G06F 1/1607 345/173 |
| 2010/0302168 A1* | 12/2010 | Giancarlo | ............. | G06F 3/0202 345/169 |
| 2010/0315348 A1* | 12/2010 | Jellicoe | ................. | G06F 1/1632 345/173 |
| 2011/0006992 A1* | 1/2011 | Cha | ...................... | G06F 1/1666 345/169 |
| 2011/0248838 A1 | 10/2011 | Krahenbuhl et al. | | |
| 2012/0039023 A1* | 2/2012 | Renwick | ............... | G06F 1/1626 361/679.01 |
| 2012/0287051 A1* | 11/2012 | Takabu | .................. | G06F 3/0202 345/169 |
| 2012/0328349 A1* | 12/2012 | Isaac | .................... | G06F 3/04886 400/491 |
| 2013/0102727 A1 | 4/2013 | Leblanc | | |
| 2013/0335327 A1* | 12/2013 | Solomon | ................ | G06F 3/0202 345/168 |
| 2014/0055363 A1* | 2/2014 | Meierling | ............... | G06F 3/039 345/169 |
| 2014/0274214 A1* | 9/2014 | Kim | ........................ | G06F 3/048 455/566 |
| 2014/0333542 A1* | 11/2014 | Barreca | ................. | G06F 1/1669 345/169 |
| 2015/0229754 A1* | 8/2015 | Won | ................... | G06F 3/04886 455/575.8 |
| 2015/0234591 A1* | 8/2015 | Park | ....................... | G06F 1/1677 345/173 |
| 2016/0320810 A1* | 11/2016 | Kim | ........................ | G06F 1/1669 |
| 2017/0010680 A1 | 1/2017 | Bryant | | |

FOREIGN PATENT DOCUMENTS

| | | |
|---|---|---|
| KR | 10-1415514 B1 | 7/2014 |
| KR | 101415514 B1 * | 7/2014 |
| KR | 10-2015-0094231 A | 8/2015 |
| KR | 10-1587436 B1 | 1/2016 |
| KR | 10-2017-0054072 A | 5/2017 |
| WO | 2016/057591 A1 | 4/2016 |

* cited by examiner

COVER DEVICE, AND ELECTRONIC DEVICE AND METHOD FOR IDENTIFYING COVER DEVICE

CROSS-REFERENCE TO RELATED APPLICATION(S)

This application is based on and claims priority under 35 U.S.C. § 119(a) of a Korean patent application number 10-2017-0106284, filed on Aug. 22, 2017, in the Korean Intellectual Property Office, the disclosure of which is incorporated by reference herein in its entirety.

BACKGROUND

1. Filed

The disclosure relates to a cover device. More particularly, the disclosure relates to an electronic device and method for identifying the cover device.

2. Description of the Related Art

Recently, various services and additional functions provided by electronic devices are gradually expanding. In order to increase the effective value of such electronic devices and satisfy various needs of users, communication service providers or electronic device manufacturers provide more functions and develop electronic devices competitively in order to differentiate them from other companies.

The electronic devices are capable of providing various functions, such as an entertainment function (e.g., a game function), a multimedia function (e.g., a music/video reproducing function), a communication and security function for mobile banking or the like, a schedule management function, an e-wallet function, or the like, in addition to a communication function, for example. An electronic device may be equipped with various additional devices in order to provide these various functions.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a portable electronic device may provide virtual keys for a user interface on a display thereof. (The virtual keys are displayed on the touch screen display, and the user is able to input items by touching the virtual keys). However, many users may want to operate the electronic device using physical keys such as a conventional keyboard or a joystick. In addition, the virtual keys cannot provide the user with a tactile sense provided when physical keys are pressed, thereby reducing the satisfaction of the user.

Additional aspects will be set forth in part in the description which follows and, in part, will be apparent from the description, or may be learned by practice of the presented embodiments.

Another aspect of the disclosure is to provide a front cover including various types of physical keys.

Another aspect of the disclosure is to provide an electronic device configured to identify a front cover including various types of physical keys.

Another aspect of the disclosure is to provide various functions to an electronic device through a plurality of C-touch type front cover.

Various embodiments disclosed herein may distinguish a plurality of C-touch type front covers using a single rear cover.

In addition, various embodiments disclosed herein may use a variety of front covers newly purchased through a rear cover already purchased by the user, and adaptively display the screen of the display device according to the attachment of various front covers.

Various embodiments disclosed herein relate to a cover device and an electronic device and method for identifying the cover device.

In accordance with another aspect of the disclosure, a cover device detachably mounted on an electronic device, in which the cover device is provided. The cover device includes a case member detachably provided on the electronic device, a printed circuit board, one or more key tops disposed on one face of the printed circuit board and exposed to the exterior through the case member, and a plurality of conductor pads disposed on other face of the printed circuit board such that at least some of the conductor pads correspond to the one or more key tops. At least one of a number, shape, or arrangement of the conductor pads may correspond to identification information of the cover device.

In accordance with another aspect of the disclosure, an electronic device is provided. The electronic device includes a housing, a wireless communication circuit disposed within the housing, a touch screen display exposed to the exterior, and a processor disposed within the housing and electrically connected to the wireless communication circuit and the touch screen display. The processor may be configured to sense mounting of the cover device on the touch screen display, identify a conductor pattern of the mounted cover device by scanning the touch screen display on which the cover device is mounted, and identify the mounted cover device on the basis of the identified conductor pattern.

In accordance with another aspect of the disclosure, a method of identifying a cover device attached to an electronic device is provided. The method includes sensing mounting of the cover device on a touch screen display of the electronic device, identifying a conductor pattern of the mounted cover device by scanning the touch screen display on which the cover device is mounted, and identifying the mounted cover device based on the identified conductor pattern.

In accordance with another aspect of the disclosure, an electronic device receives a user input and/or recognizes a cover device through a plurality of conductor pads configured on a front cover, so that a user can use various cover devices including physical keys and the user's convenience can be improved.

In accordance with another aspect of the disclosure, an electronic device identifies an attached rear cover and various front covers, and adaptively displays a screen of a display device according to the type of the identified front covers, so that the user's convenience can be improved.

In accordance with another aspect of the disclosure, an electronic device receives information about various types of front covers from a rear cover device or an external device (e.g., a server), so that the front covers can be adaptively utilized.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
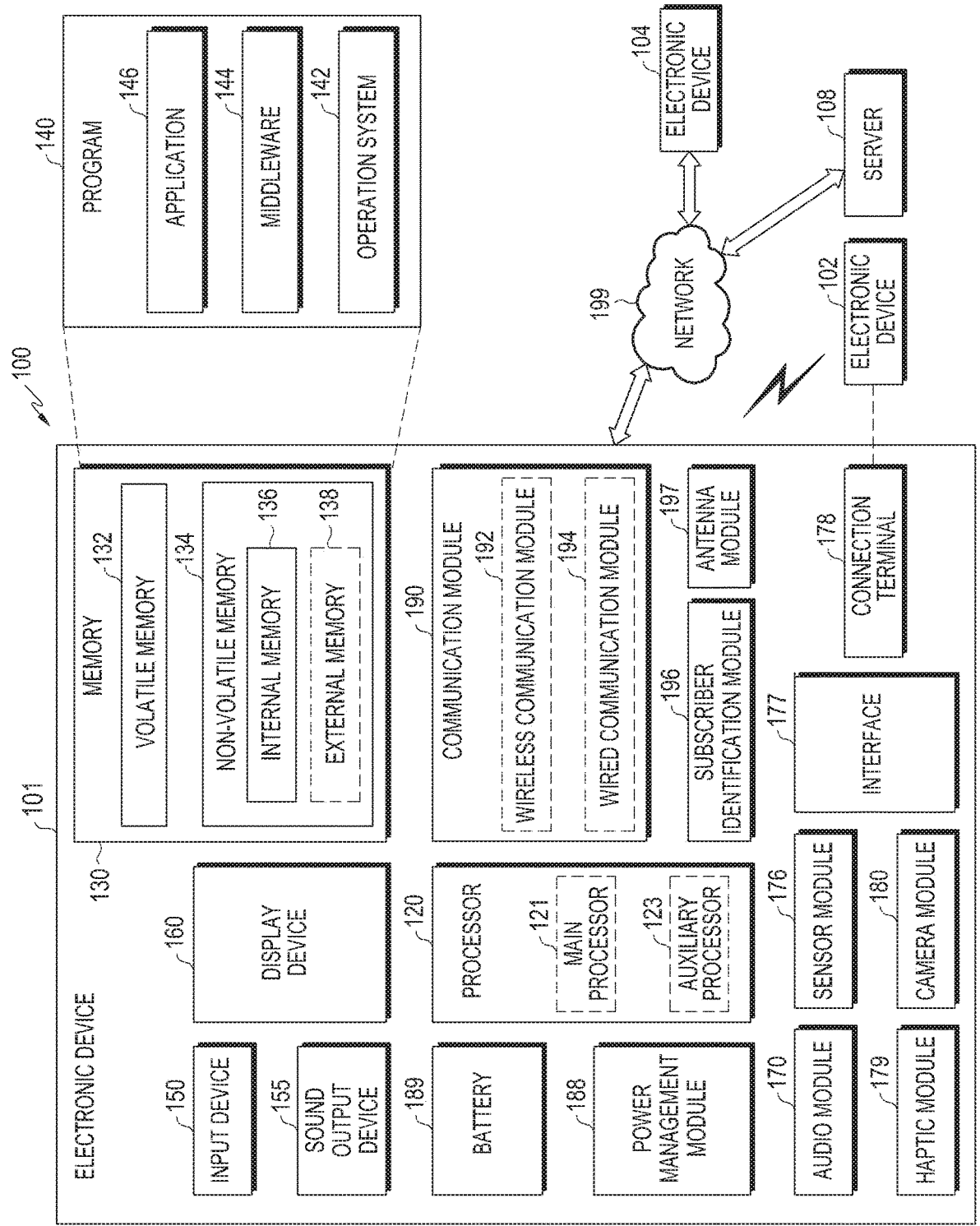
FIG. 1 is a block diagram illustrating an electronic device in a network environment, according to an embodiment of the disclosure.

FIG. 1 is a block diagram illustrating an electronic device in a network environment, according to an embodiment of the disclosure.

Referring to FIG. 1, the electronic device 101 in the network environment 100 may communicate with an electronic device 102 via short-range wireless communication, or may communicate with an electronic device 104 or a server 108 via a second network 199 (e.g., long-range wireless communication). The electronic device 101 may communicate with the electronic device 104 via the server 108. The electronic device 101 may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module 196, and an antenna module 197. In some embodiments, at least one (e.g., the display device 160 or the camera module 180) of these components may be eliminated from the electronic device 101 or other components may be added to the electronic device 101. In some embodiments, some components may be implemented in an integrated form like the sensor module 176 (e.g., a fingerprint sensor, an iris sensor, or an illuminance sensor), which is embedded in, for example, the display device 160 (e.g., a display).

The processor 120 may control one or more other components (e.g., a hardware or software component) of the electronic device 101, which are connected to the processor 120, and may perform various data processing and arithmetic operations by driving, for example, software (e.g., a program 140). The processor 120 may load commands or data, which are received from other components (e.g., the sensor module 176 or the communication module 190), into a volatile memory 132 so as to process the commands or data, and may store resulting data into a non-volatile memory 134. According to one embodiment, the processor 120 may include a main processor 121 (e.g., a central processing unit or an application processor), and an auxiliary processor 123, which operates independently from the main processor 121, additionally or alternatively uses a lower power than the main processor 121, or includes an auxiliary processor 123 specialized for a designated function (e.g., a graphic processor device, an image signal processor, a sensor hub processor, or a communication processor). The auxiliary processor 123 may be operated separately from the main processor 121 or in the manner of being embedded with the main processor 121.

The auxiliary processor 123 may control at least some functions or states associated with at least one of the components of the electronic device 101 (e.g., the display device 160, the sensor module 176, or the communication module 190), on behalf of the main processor 121, for example, while the main processor 121 is in an inactive (e.g., sleep) state, or together with the main processor 121 while the main processor 121 is in an active (e.g., application execution) state. According to one embodiment, the auxiliary processor 123 (e.g., an image signal processor or a communication processor) may be implemented as some of other functionally related components (e.g., camera module 180 or communication module 190). The memory 130 may store various data used by at least one component (e.g., the processor 120 or the sensor module 176) of electronic device 101, for example, software (e.g., the program 140) and input or output data, which is associated with commands associated the software. The memory 130 may include, for example, a volatile memory 132 or a non-volatile memory 134.

The program 140 may be software stored in the memory 130 and may include an operating system 142, middleware 144, or application 146.

The input device 150 is a device for receiving commands or data to be used in a component (e.g., the processor 120) of the electronic device 101 from the outside (e.g., the user) of the electronic device, and may include a microphone, a mouse, or a keyboard.

The sound output device 155 is a device for outputting a sound signal to the outside of the electronic device 101. The output device 155 may include a speaker for general use such as multimedia reproduction or sound reproduction and a receiver used only for telephone reception. According to one embodiment, the receiver may be formed integrally with or separately from the speaker.

The display device 160 is a device for visually providing information to a user of the electronic device 101 and may include a display, a hologram device, or a projector and a control circuit for controlling the corresponding device. According to one embodiment, the display device 160 may include a touch circuit or a pressure sensor capable of measuring the intensity of the pressure on the touch.

The audio module 170 may bidirectionally convert sound and electrical signals. The audio module 170 may acquire sound through the input device 150 or may output sound through the sound output device 155 or an external electronic device (e.g., the electronic device 102 (e.g., a speaker or headphone)) connected with the electronic device 101 in a wireless or wired manner.

The sensor module 176 may generate an electrical signal or a data value corresponding to an internal operating state (e.g., power or temperature) of the electronic device 101 or an external environmental condition. The sensor module 176 may include a gesture sensor, a gyro sensor, an atmospheric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 177 may support a designated protocol that may be connected to an external electronic device (e.g., the electronic device 102) in a wired or wireless manner. The interface 177 may include a high definition multimedia interface (HDMI), a universal serial bus (USB) interface, a secure digital (SD) card interface, or an audio interface.

The connection terminal 178 may include a connector capable of physically interconnecting the electronic device 101 and an external electronic device (e.g., the electronic device 102), such as an HDMI connector, a USB connector, an SD card connector, or an audio connector (e.g., a headphone connector).

The haptic module 179 may convert an electrical signal into a mechanical stimulus (e.g., vibration or motion) or an electrical stimulus that the user can perceive through a tactile or kinesthetic sense. The haptic module 179 may include a motor, a piezoelectric element, or an electrical stimulation device.

The camera module 180 is a device that is capable of capturing a still image and a video image. The camera module 180 may include one or more lenses, an image sensor, an image signal processor, or a flash.

The power management module 188 is a module for managing power supplied to the electronic device 101, and may be configured as at least a part of a power management integrated circuit (PMIC).

The battery 189 is a device for supplying power to at least one component of the electronic device 101 and may include a non-rechargeable primary battery, a rechargeable secondary battery, or a fuel cell.

The communication module 190 may establish a wired or wireless communication channel between the electronic device 101 and an external electronic device (e.g., the electronic device 102, the electronic device 104, or the server 108) and may support communication via the established communication channel. The communication module 190 may include a processor 120 (e.g., an application processor) and one or more communication processors, which are independently operated and support wired communication or wireless communication. The communication module 190 may include a wireless communication module 192 (e.g., a cellular communication module, a short range wireless communication module, or a global navigation satellite system (GNSS) communication module) or a wired communication module 194 (e.g., a local area network (LAN) communication module or a power line communication module), and may communicate with an external electronic device via a short-range communication network (e.g., a short-range communication network, such as Bluetooth (BT), WiFi direct, or infrared data association (IrDA)) or a network 199 (e.g., a long-range communication network, such as a cellular network, the Internet, or a computer network (e.g., a LAN or a wide area network (WAN)), using a corresponding communication module among the above-mentioned communication modules. Various types of communication modules 190 described above may be implemented as a single chip or may be implemented as separate chips, respectively.

The wireless communication module 192 may identify and authenticate the electronic device 101 within the communication network using the user information stored in the subscriber identification module 196.

The antenna module 197 may include one or more antennas configured to transmit/receive signals or power to/from the outside. The communication module 190 (e.g., the wireless communication module 192) may transmit/receive signals to/from an external electronic device via an antenna suitable for the communication scheme thereof.

Among the components described above, some components may be connected to each other via a communication scheme among peripheral devices (e.g., a bus, a general-purpose input/output (GPIO), a serial peripheral interface (SPI), or a mobile industry processor interface (MIPI)) and may exchange signals (e.g., commands or data) therebetween.

The commands or data may be transmitted or received between the electronic device 101 and the external electronic device 104 via the server 108 connected to the network 199. Each of the electronic devices 102 and 104 may be of a type, which is the same as or different from the electronic device 101. All or some of the operations executed in the electronic device 101 may be executed in another external electronic device or a plurality of external electronic devices. In the case where the electronic device 101 should perform a certain function or service automatically or by a request, the electronic device 101 may request some functions, which are associated with the function or service, from an external electronic device, instead of, or in addition to, executing the functions or the service by itself. The external electronic device, which receives the request, may execute the requested functions or additional functions, and may transmit the results to the electronic device 101. The electronic device 101 may provide the requested functions or services by processing the received results as they are or additionally. For this purpose, for example, a cloud computing technique, a distributed computing technique, or a client-server computing technique may be used.

Figure 2:
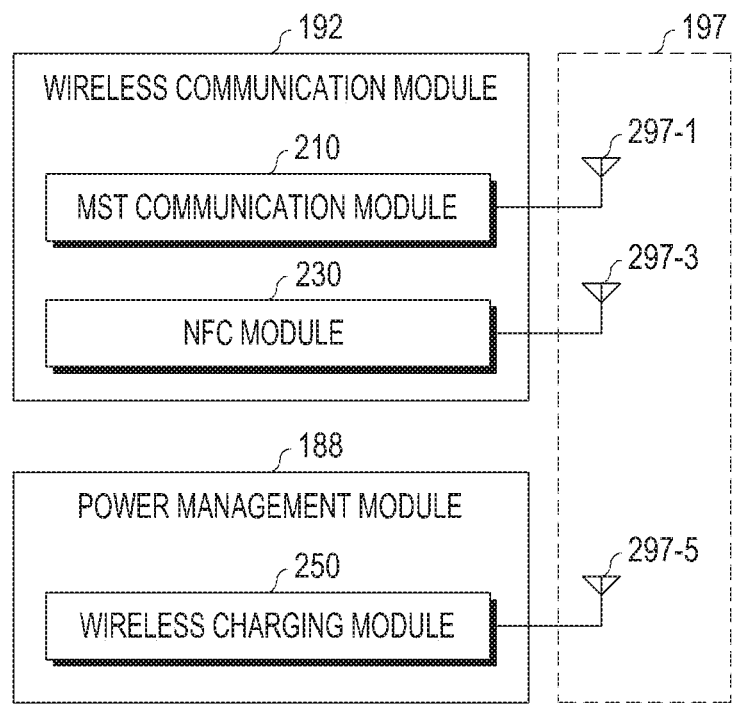
FIG. 2 is a block diagram illustrating a wireless communication module, a power management module, and an antenna module of an electronic device, according to an embodiment of the disclosure.

FIG. 2 is a block diagram illustrating a wireless communication module, a power management module, and an antenna module of an electronic device, according to an embodiment of the disclosure.

Referring to FIG. 2, the wireless communication module 192 may include a magnetic secure transmission (MST) communication module 210 or a near field communication (NFC) module 230, and the power management module 188 may include a wireless charging module 250. The antenna module 197 may separately include a plurality of antennas, which include an MST antenna 297-1 connected to the MST communication module 210, an NFC antenna 297-3 connected to the NFC module 230, and a wireless charging antenna 297-5 connected to the wireless charging module 250. The wireless communication module 192 may receive an identifier of the cover device from a cover device (e.g., the rear cover 301 of FIG. 3). For the convenience of description, components overlapping with those in FIG. 1 will not omitted or will be described briefly.

The MST communication module 210 may receive a signal (e.g., a signal including control information or settlement information) from the processor 120, may generate a magnetic signal corresponding to the received signal via the MST antenna 297-1, and may then transmit the generated magnetic signal to an external electronic device 102 (e.g., a point of sale (POS) device). For example, the MST communication module 210 may include a switching module (not illustrated), which includes one or more switches connected to the MST antenna 297-1, and may change the direction of the voltage or current supplied to the MST antenna 297-1 by controlling the switching module. The voltage or current may be sent via the MST antenna 297-1 so as to change the direction of a magnetic signal (e.g., a magnetic field) transmitted to an external electronic device 102 via, for example, short-range communication 198. The magnetic signal, which is transmitted in the state in which the direction thereof is changed, may cause a form and effect similar to magnetic field that is generated when a magnetic card is swiped in a card reader of an electronic device 102. Settlement-related information and a control signal, which are received in the form of magnetic signals by an electronic device 102, are transmitted to the settlement server (e.g., a server 108) via the network 199.

The NFC module 230 may acquire signals (e.g., the signal including the control information or settlement information) from the processor 120, and may transmit the acquired signal to an external electronic device 102 via the NFC antenna 297-3. The NFC module 230 may receive signals (e.g., signals including the control information or settlement information) sent from an external electronic device 102 via the NFC antenna 297-3.

The wireless charging module 250 may wirelessly transmit power to the external electronic device 102 (e.g., a mobile phone or a wearable device) via a wireless charging antenna 297-5, or may wirelessly receive power from an external electronic device 102 (e.g., a charging device). The wireless charging module 250 may support various wireless charging schemes including, for example, a magnetic resonance scheme or magnetic induction scheme.

According to one embodiment, among the MST antenna 297-1, the NFC antenna 297-3, and the wireless charging antenna 297-5, some antennas may share at least a part of a radiation unit. For example, the radiation unit of the MST antenna 297-1 may be used as the radiation unit of the NFC antenna 297-3 or the wireless charging antenna 297-5, and vice versa. When the MST antenna 297-1, the NFC antenna 297-3, and the wireless charging antenna 297-5 share at least a partial region of a radiation unit, the antenna module 197 may include a switching circuit (not illustrated) configured to selectively connect or disconnect (e.g., open) at least some of the antennas 297-1, 297-2, and 297-3 under the control of the wireless communication module 192 (e.g., the MST communication module 210 or the NFC module 230) or the power management module (e.g., the wireless charging module 250). For example, when the electronic device 101 uses the wireless charging function, the NFC module 230 or the wireless charging module 250 may temporally disconnect at least a partial region of the radiation unit, which is shared by the NFC antenna 297-3 and the wireless charging antenna 297-5, from the NFC antenna 297-3 and may connect the partial region of the radiation unit only to the wireless charging antenna 297-5 by controlling the switching circuit.

At least some functions of the MST communication module 210, the NFC module 230, and the wireless charging module 250 may be controlled by an external processor (e.g., the processor 120). The designated functions (e.g., a settlement function) of the MST communication module 210 or the NFC module 230 may be performed in a trusted execution environment (TEE). The TEE may be an execution environment in which at least some designated regions in the memory 130 are assigned in order to carry out, for example, functions that require a relatively high level of security (e.g., financial transaction or personal information-related functions) and access to the designated regions is distinguished and limitedly allowed depending on, for example, an access subject or an application to be executed.

The electronic device disclosed herein may be various types of devices. The electronic device may include at least one of a portable communication device (e.g., smartphone) a computer device, a portable multimedia device, a portable medical device, a camera, a wearable device, and a home appliance. The electronic device is not limited to the above described devices.

The embodiments and the terms used therein are not intended to limit the technology disclosed herein to specific forms, and should be understood to include various modifications, equivalents, and/or alternatives to the corresponding embodiments. In describing the drawings, similar reference numerals may be used to designate similar constituent elements. A singular expression may include a plural expression unless they are definitely different in a context. In the disclosure, the expression "A or B", "at least one of A or/and B", or "one or more of A or/and B" may include all possible combinations of the items listed. The expression "a first", "a second", "the first", or "the second" may modify corresponding elements regardless of the order or importance, and is used only to distinguish one element from another element, but does not limit the corresponding elements. When an element (e.g., first element) is referred to as being "(functionally or communicatively) connected," or "directly coupled" to another element (second element), the element may be connected directly to the another element or connected to the another element through yet another element (e.g., third element).

The term "module" as used herein may include a unit consisting of hardware, software, or firmware, and may, for example, be used interchangeably with the term "logic", "logical block", "component", "circuit", or the like. The "module" may be an integrated component, or a minimum unit for performing one or more functions or a part thereof. For example, the module may be implemented by an application-specific integrated circuit (ASIC).

Various embodiments as described herein may be implemented by software (e.g., program 140) including an instruction stored in machine-readable storage media (e.g., internal memory 136 or external memory 138). The machine is a device that calls the stored instruction from the storage media and can operate according to the called instruction, and may include an electronic device (e.g., electronic device 101) according to the disclosed embodiments. The instruction, when executed by a processor (e.g., processor 120), may cause the processor to directly execute a function corresponding to the instruction or cause other elements to execute the function under the control of the processor. The instruction may include a code that is generated or executed by a compiler or interpreter. The machine-readable storage media may be provided in the form of non-transitory storage media. The term "non-transitory" only means that the storage media is tangible without including a signal, irrespective of whether data is semi-permanently or transitorily stored in the storage media.

A method according to various embodiments disclosed herein may be provided in the manner of being included in a computer program product. A computer program product may be traded between a seller and a purchaser as a commodity. The computer program product may be distributed on-line in the form of a machine-readable storage medium (e.g., a compact disc read only memory (CD-ROM)) or via an application store (e.g., Google Play Store™). In the case of on-line distribution, at least a part of the computer program product may be at least temporarily stored in or temporarily produced from a storage medium such as a manufacturer's server, a server of an application store, or a memory of a relay server.

Each component (e.g., a module or a program) according to various embodiments may be configured as a single entity or a plurality of entities, and some sub-components of the aforementioned sub-components may be omitted, or other sub-components may be further included in various embodiments. Alternatively or additionally, some components (e.g., a module or a program) may be integrated as a single entity so as to perform the functions performed by respective components prior to integration in a similar or same manner. Operations performed by the modules, the programs, or other components according to various embodiments may be performed sequentially, in parallel, repetitively, or heuristically, or at least some operations may be performed in a different order or omitted, or other operations may be added thereto.

Figure 3:
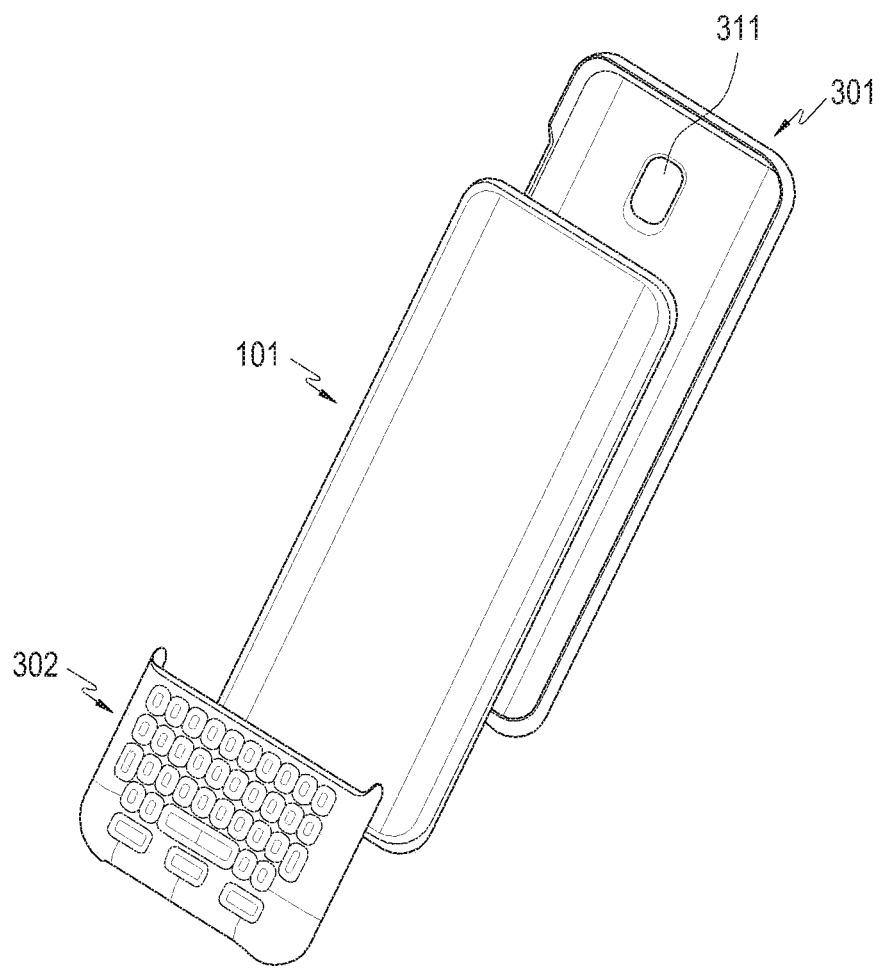
FIG. 3 is a perspective view illustrating an electronic device and a cover device thereof according to an embodiment of the disclosure.

FIG. 3 is a perspective view illustrating an electronic device and a cover device thereof according to an embodiment of the disclosure.

Referring to FIG. 3, an electronic device 101 (e.g., the electronic device 101, 102, or 104 of FIG. 1) may provide substantially the entire area of the front face as a display region. The electronic device 101 may include a touch panel, a digitizer, a microphone, a speaker, various sensors, and the like in order to input/output various information. In one embodiment, the touch pad and digitizer may be integrated with a display device (e.g., display device 160 of FIG. 1).

The cover devices 301 and 302 may be detachably provided in the electronic device 101, and may include, for example, a first cover device 301 (e.g., a rear cover) coupled to the rear face of the electronic device 101 and a second cover device 302 (e.g., a front cover) mounted on the front face (e.g., at least a part of the display region) of the electronic device 101. The cover devices 301 and 302 are capable of protecting the electronic device 101 from the external environment and capable of improving a function incorporated in the electronic device 101 or providing the electronic device 101 with an additional function. According to one embodiment, the cover devices 301 and 302 (e.g., the first cover device 301) may include at least one lens corresponding to a camera module (e.g., the camera module 180 of FIG. 1) of the electronic device 101, thereby enhancing the optical function. In another embodiment, the cover devices 301 and 302 may provide an auxiliary power source to the electronic device 101 or provide an external memory (e.g., the external memory 138 of FIG. 1).

The second cover device 302 may be mounted on the display region (e.g., the display device 160 in FIG. 1) of the electronic device 101, for example, on the display region having a touch screen function incorporated therein. In FIG. 3, the second cover device 302 may provide a QWERTY keypad, and may be used for inputting characters and the like in combination with the touch screen function of the electronic device 101. In some embodiments, when the keypads of the second cover device 302 include a dome switch or the like, a user experience (e.g., a click feel), which is different from that provided by the electronic device 101 itself, may be provided. The second cover device 302 may be manufactured as various types of keypads, such as a keypad used for camera operation, a keypad used for game operation, and a keypad used for multimedia reproduction or used as function keys frequently used in the electronic device.

Figure 4:
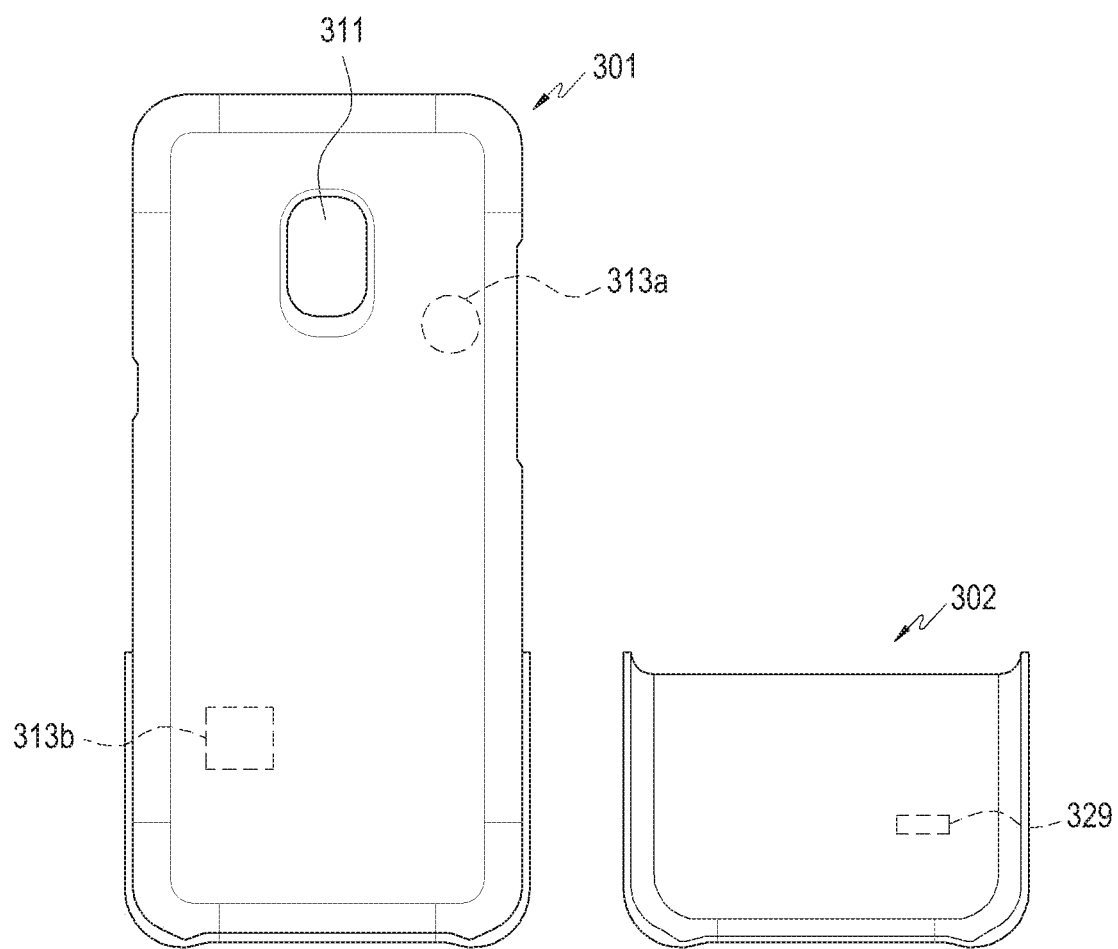
FIG. 4 is a view illustrating a cover device of an electronic device according to an embodiment of the disclosure.

FIG. 4 is a view illustrating a cover device of an electronic device according to various embodiments of the disclosure.

Referring to FIG. 4, the first cover device 301 is generally provided detachably on the rear face of the electronic device 101, and when a camera module is provided on the rear face of the electronic device 101, the first cover device 301 may include an opening 311 corresponding to the camera module, thereby providing an image capture route. The first cover device 301 may include a first magnetic body 313a and/or an identification chip 313b. For example, when the first cover device 301 is intended to provide a simple protection function, the first cover device 301 may not include the first magnetic material 313a and/or the identification chip 313b. When the first cover device 301 is intended to improve the functions of the electronic device 101 or to provide additional functions, the first cover device may provide information on the corresponding functions or the like to the electronic device 101 through the first magnetic body 313a and/or the identification chip 313b. When the first cover device 301 includes at least one lens mounted in the opening 311, the first magnetic body 313a and/or the identification chip 313b may store information on a macro mode, a telephoto mode, and the like, among the camera modes. The first magnetic body 313a and/or the identification chip 313b may be identified through a Hall sensor, a short-range wireless communication antenna, or the like, which is mounted on the electronic device 101, and a separate power source may not be built in the first cover device 301.

The first magnetic body 313a of the first cover device 301 is sensed through a sensor (e.g., a Hall sensor) of the above-described electronic device (e.g., the electronic device 101 of FIG. 1), so that it is possible to sense whether or not the first cover is mounted. Upon sensing the first magnetic body, the electronic device 101 is capable of activating a communication module.

The electronic device may receive identification information stored in the identification chip 313b of the first cover device 301 via the wireless communication module 192. The identification information may include at least one of a type, an item name, an identification (ID), and additional information of a cover accessory. For example, in the case where the cover device is a flip cover, the wireless communication module 192 of the electronic device may receive identification information for the flip cover. The first cover 301 may provide an environment in which the user is capable of using the second cover device 302. For example, when the first cover device 301 is mounted, the electronic device 101 is capable of recognizing that another cover device (e.g., the second cover device 302) may be additionally mounted on the basis of an identifier or the like provided from the first magnetic body 313 a and/or the identification chip 313b.

The second cover device 302 may provide an identifier or the like to the electronic device 101 via another magnetic body (e.g., a second magnetic body 329), conductor pads 327c, or the like, and it is possible to recognize whether or not the second cover device 302 is mounted, the type (and/or function) (e.g., a qwerty keypad, a keypad for a camera, a keypad for a game, a multimedia keypad, or the like) of the second cover device 302, and the like through the identifier or the like provided from the second cover device 302.

It is possible to identify whether or not the second cover device 301 is mounted in the electronic device 110 and/or the type of the second cover device 301 in the state in which the first cover device 301 is mounted. However, the disclosure is not limited thereto. As described above, on the basis of the identifier or the like provided by the second cover device 302, the electronic device 101 may identify whether or not the second cover device 302 is mounted and/or the type of the second cover device 302.

The second cover device 302 may include a second magnetic body 329 and may be detachably provided on the front face (e.g., a display device) of the electronic device 101. By including a Hall sensor disposed on a front face (e.g., a display region or a peripheral region thereof), the electronic device 101 is able to sense the second magnetic body 329. On the basis of this, it is possible to identify whether or not the cover device 302 is mounted or the type or function of the mounted second cover device 302 (e.g., a QWERTY keypad, a camera keypad, a game keypad, a multimedia keypad, or the like). In one embodiment, the second cover device 302 may be mounted on a display region (e.g., a touch screen display) of the electronic device 101, thereby providing an input function through a touch screen display while providing a click feeling. In providing the input function, a practical input signal is generated in the touch screen display, so that the second cover device 302 can provide a user experience (e.g., a click feeling) different from a touch input while implementing an input operation even when a separate power source is not incorporated therein. An electronic device (e.g., the electronic device 101 of FIG. 1) may be able to sense the second magnetic body 329 via a Hall sensor disposed on the front face. On the basis of this, the electronic device is able to determine whether the second cover device 302 is mounted. Upon sensing that the second cover device 302 is mounted, the electronic device 101 is able to activate the touch screen display so as to detect the conductor pads 327c of the second cover device 302, and to identify the type and function of the second cover device 302 (e.g., a Qwerty keypad, a camera keypad, a game keypad, a multimedia keypad, or the like) by processing the detected contents.

As described below, the second cover device 302 may include a plurality of conductor pads (e.g., conductor pads 327c of FIG. 7 or 8) and on the basis of the number, shape, and arrangement of the conductor pads, the second cover device 302 is able to provide an identifier (e.g., identification information on the type or incorporated function of the second cover device 302) to the electronic device 101. On the basis of the identifier, the electronic device 101 is able to identify whether or not the second cover device 302 is mounted, the type of the second cover device 302, the function incorporated in the second cover device 302, or the like. For example, even if the second magnetic body 329 is not included and/or even if the first cover device 301 is not interposed, the second cover device 302 may provide an identifier using conductor pads or the like to the electronic device 101. The number and arrangement of the conductor pads will be described in more detail with reference to FIG. 8 etc.

Figure 5:
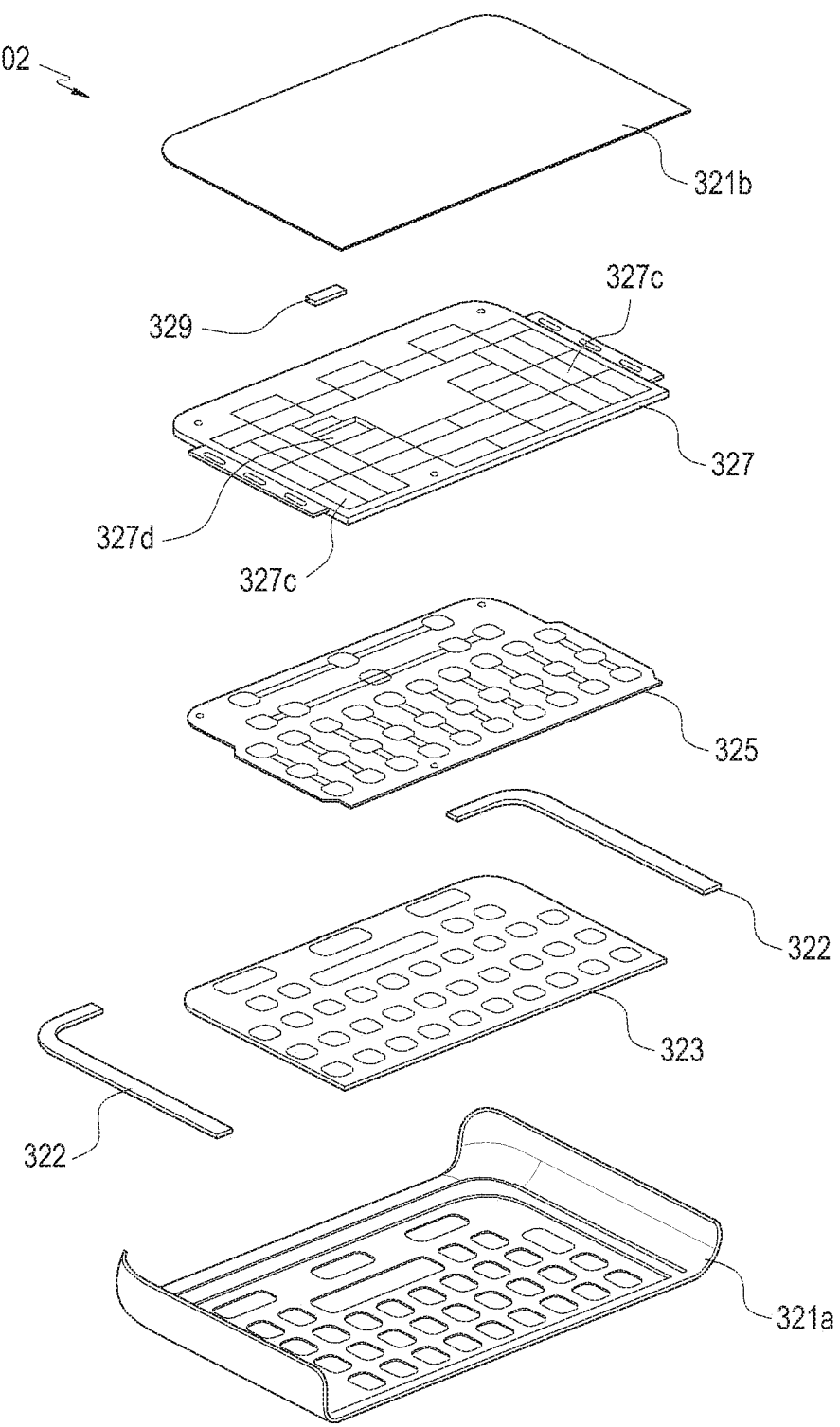
FIG. 5 is an exploded perspective view illustrating a second cover device of an electronic device according to an embodiment of the disclosure.
Figure 6:
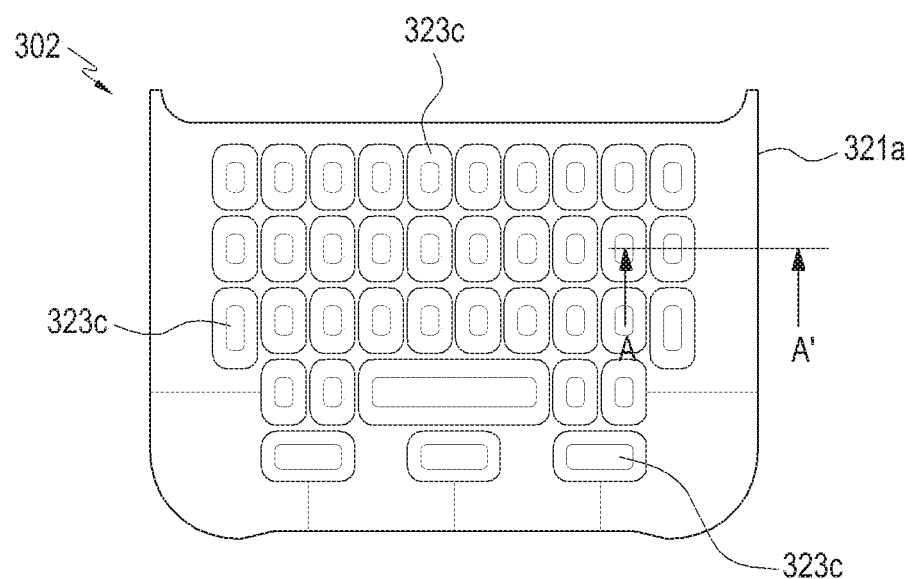
FIG. 6 is a plan view illustrating the second cover device of the electronic device according to an embodiment of the disclosure.

FIG. 5 is an exploded perspective view illustrating a second cover device of an electronic device according to an embodiment of the disclosure; FIG. 6 is a plan view illustrating the second cover device of the electronic device according to various embodiments of the disclosure; and FIG. 7 is a cross-sectional view of the second cover device, which is taken along line A-A' in FIG. 6, according to an embodiment of the disclosure.

Figure 7:
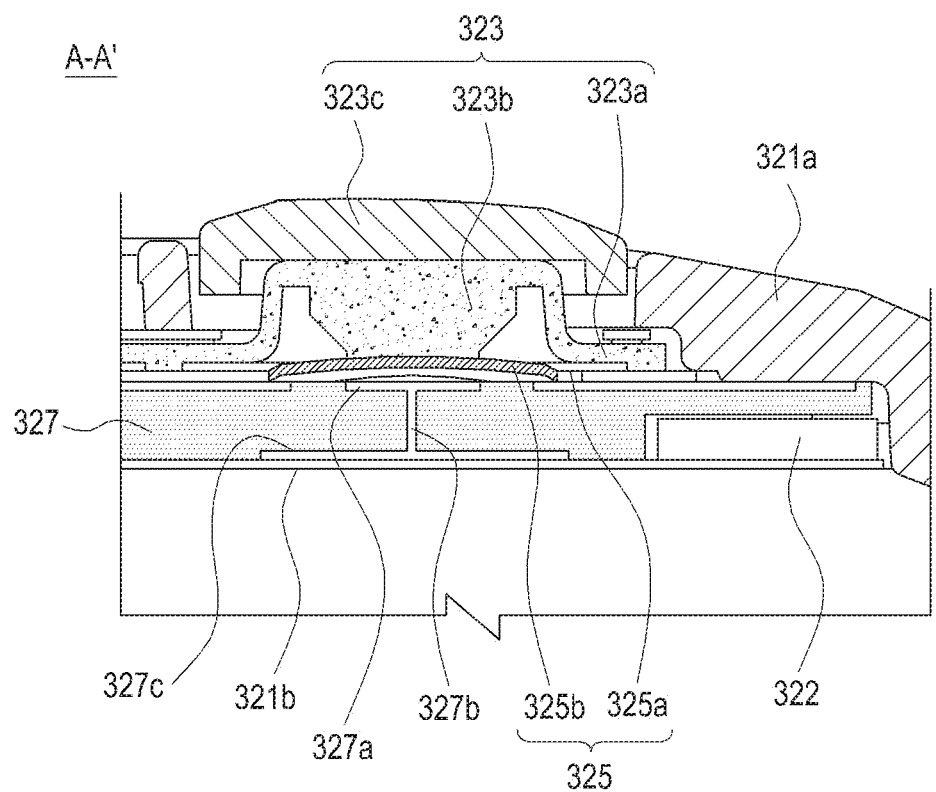
FIG. 7 is a cross-sectional view of the second cover device, which is taken along line A-A' in FIG. 6 according to an embodiment of the disclosure.

Referring to FIGS. 5 to 7, the second cover device 302 may include a case member 321a detachably provided in the electronic device (e.g., the electronic device 101 in FIG. 3), and a keypad member 323, a dome sheet 325, and a printed circuit board 327, each of which is at least partially accommodated in the case member 321a.

The case member 321a may provide a practical external appearance of the second cover device 302 and a space for accommodating and mounting therein the printed circuit board 327 or the like. The keypad member 323 may include a plurality of key tops 323c mounted on the inner face of the case member 321a and exposed to the outside through the through holes formed in the case member 321a. For example, the keypad member 323 may include a keypad base 323a made of a material, which is excellent in elastic restoration force, such as silicone or urethane, and the key tops 323c may be mounted on the outer face of the keypad base 323a. A plurality of operation protrusions 323b each corresponding to one of the key tops 323c may be formed on the inner face of the keypad base 323a. The keypad base 323a is mounted on and fixed to the inner face of the case member 321a, and the key tops 323c may be exposed to the outside of the case member 321a through respective corresponding through holes.

The dome sheet 325 may include a film 325a on which a plurality of metal domes 325b are arranged. The film 325a is disposed to face the inner face of the keypad member 323, for example, the keypad base 323a, and each of the metal domes 325b faces one of the operation protrusions 323b. The dome sheet 325 may be attached to one face of the printed circuit board 327 (e.g., the upper face of the printed circuit board 327 in FIG. 7).

A plurality of conductor pads 327c may be disposed on one face of the printed circuit board 327 (e.g., the bottom face of the printed circuit board 327 in FIG. 7). The conductor pads 327c may be disposed generally to correspond to the arrangement of the key tops 323c. Some of the conductor pads 327c may be disposed slightly offset from the corresponding (electrically connected) key tops. A plurality of dome pads 327a may be formed on the other face of the printed circuit board 327, for example, on the face facing the dome sheet 325. The dome pads 327a may be disposed each to correspond to one of the metal domes 325b. For example, when the key tops 323c are operated, the operation protrusions 323b are able to press the central portions of the metal domes 325b to come into contact with the dome pads 327a, and the metal domes 325b and/or other conductors connected to the metal domes 325b may be electrically connected to the dome pads 327a. When the dome sheet 325 is coupled to the printed circuit board 327, the metal domes 325b are disposed each to correspond to one of the dome pads 327a so as to form a plurality of dome switches.

The printed circuit board 327 may include a via hole 327b (and/or a printed circuit pattern (e.g., a printed circuit pattern 327f of FIG. 8) that connects each of the dome pads 327a to one of the conductor pads 327c. For example, each of the dome pads 327a may be electrically connected to one of the conductor pads 327c through the via hole 327b or the like. In some embodiments, the dome pads 327a and the conductor pads 327c corresponding thereto may be slightly offset from each other in position in accordance with the shapes, arrangements, etc. of the key tops 323c, the metal domes 325b, the dome pads 327a, and/or the conductive pads 327c. In this case, additional printed circuit patterns (e.g., printed circuit patterns 327f of FIG. 8) connecting the dome pads 327a and the via holes 327b and/or connecting the conductor pads 327c and the via holes 327b may be provided on the printed circuit board 327.

The printed circuit board 327 may be mounted on and fixed to the inner face of a case member 321a in the state in which the keypad member 323 is restricted to the inner face of the case member 321a. In one embodiment, the second cover device 302 may further include a support member 322 fastened and fixed to the inner face of the case member 321a, and may be fixed to the case member 321a in the state of restraining at least a part of the edge portion of the printed circuit board 327. In some embodiments, when the second cover device 302 includes the second magnetic body 329, the printed circuit board 327 may provide means for mounting and fixing the second magnetic body by including an accommodation groove 327d.

The second cover device 302 may further include a cover sheet 321b attached to an inner face of the case member 321a (practically one face of the printed circuit board 327). The cover sheet 321b is able to prevent the conductor pads 327c from being damaged by concealing one face of the printed circuit board 327 from the external environment. In another embodiment, the second cover device 302 may further include one or more dummy conductors disposed on the other face of the printed circuit board 327. The dummy conductors support the edge portions of the metal domes 325b, and may be electrically connected to the metal domes 325b. When the metal domes 325b are manipulated to come into contact with the dome pads 327a, the dummy conductors may be electrically connected to the conductor pads 327c. In the case where the second cover device 302 is in the state of being mounted on the electronic device 101 (e.g., on the display device 160), when one of the key tops 323c is operated, a change in capacitance may occur in a region corresponding to the conductor pad (e.g., the conductor pad 327c of FIG. 7) connected to the corresponding key top. The electronic device 101 (and/or the display device 160) may generate an input signal on the basis of such a change in capacitance.

In generating such an input signal, the magnitude or change of the formed capacitance may vary depending on the size or shape of the conductor pad 327c (and/or the size or shape of the dummy conductor). For example, the accuracy in sensing the input operation may vary depending on the size or shape of the conductor pad 327c (and/or the size or shape of the dummy conductor), and the size or shape of the conductor pad 327c (and/or the size or shape of the dummy conductor) may be appropriately set according to the sensing accuracy of the required input motion detection, the practical size of the second cover device 302, and the number and arrangement of keys to be arranged, and the like.

Figure 8:
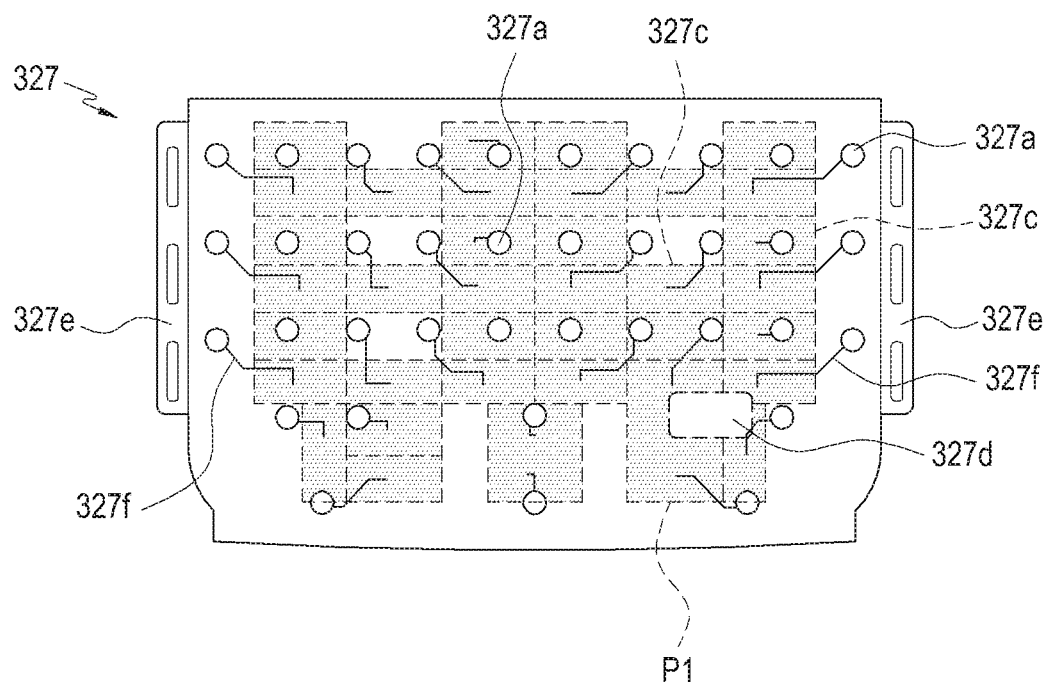
FIG. 8 is a plan view for explaining an arrangement example of conductor pads in the second cover device according to an embodiment of the disclosure.

FIG. 8 is a plan view for explaining an arrangement example of conductor pads in the second cover device according to various embodiments of the disclosure.

Referring to FIG. 8, each of the conductor pads 327c arranged on one face of the printed circuit board 327 may be electrically connected to one of the dome pads 327*a* arranged on the other face of the printed circuit board 327. In one embodiment, some of the conductor pads 327*c* are formed at positions, which are aligned with the dome pads 327*a* that correspond to some conductor pads, respectively, but the remaining ones of the conductor pads 327*c* may be formed at positions, which are not aligned with (deviated from) the dome pads 327*a* that correspond to the remaining conductor pads, respectively. In connecting the dome pad 327*a* and the conductor pads 327*c* through via holes (e.g., the via holes 327*b* in FIG. 7) or the like, the dome pads and the conductive pads, which are located to be deviated from each other, can be electrically connected to each other further via printed circuit patterns 327*f*.

According to various embodiments, a pattern P1 (hereinafter, referred to as a "first identification pattern") configured with an arrangement of conductor pads 327*c* may be used as an identifier related to the type of the second cover device (e.g., the second cover device 302 of FIG. 5). For example, when the second cover device 302 is mounted on the electronic device (e.g., the electronic device 101 of FIG. 3), capacitance may be formed in a region corresponding to the first identification pattern P1 or a change in capacitance may occur in the region. On the basis of the formation of capacitance or the change in capacitance or on the basis of the region in which the change in capacitance occurs or the center of the region, the electronic device 101 may identify whether or not the second cover device 302 is mounted or the type (and/or the function) of the second cover device 302. In addition, the electronic device 101 may activate an operation mode corresponding to the identification. For example, the electronic device 101 may recognize that the second cover device 302 having a QWERTY keypad function is mounted through the first identification pattern P1. Further, the electronic device 101 may deactivate the output of a screen in a display region corresponding to the second cover device 302, and may output a screen preset or selected by the user in the remaining display region.

In one embodiment, the accommodation groove 327*d* for accommodating the second magnetic body 329 may be disposed within the region of the first identification pattern P1. The accommodation groove 327*d* for accommodating the second magnetic body 329 may be disposed in a region other than the first identification pattern P1, in another embodiment. In some embodiments, the printed circuit board 327 may further include flanges 327*e* formed in edges thereof and support members (e.g., the support member 322 of FIG. 5) may be mounted on the case member (e.g., the case member 321*a* of FIG. 5) in the state of being fastened to the flanges 327*e*.

FIGS. 9, 10, 11, 12, 13, and 14 are views for explaining other examples of the second cover device according to various embodiments of the disclosure.

Figure 9:
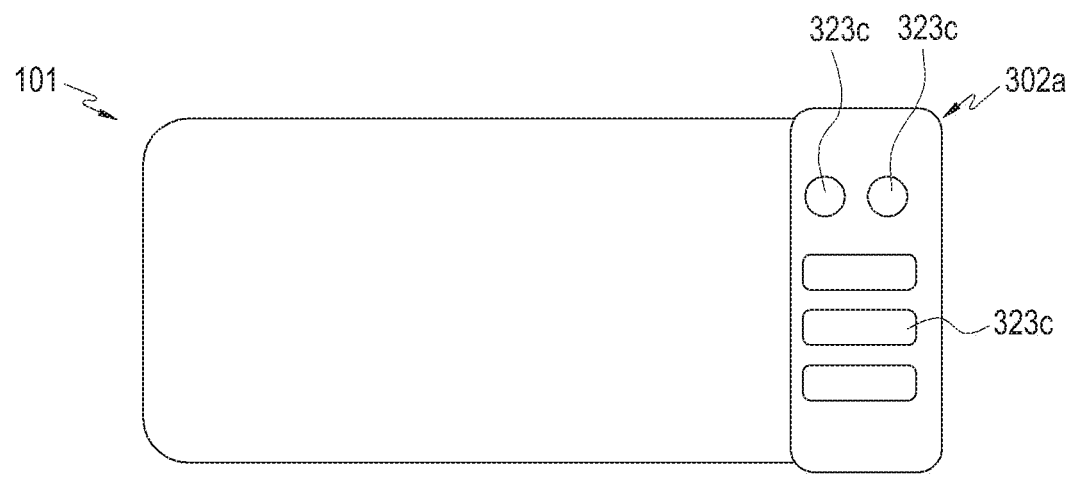
FIGS. 9, 10, 11, 12, 13, and 14 are views for explaining other examples of the second cover device according to various embodiments of the disclosure.
Figure 10:
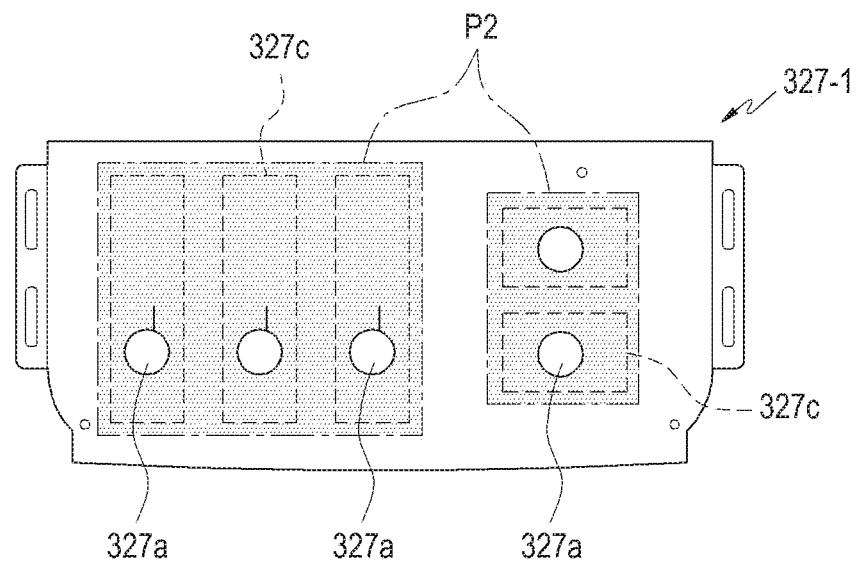

Referring to FIGS. 9 and 10, the second cover device 302*a* may be conveniently used in an image capture mode.

The dome pads 327*a* and the conductor pads 327*c* are disposed on the printed circuit board 327-1 of the second cover device 302*a* to respectively correspond to each other, and the conductor pads 327*c* may have an arrangement (hereinafter, referred to as a "second identification pattern P2") which is different from the above-described first identification pattern P1. In one embodiment, when the second cover device 302*a* is mounted, the electronic device (e.g., the electronic device 101 of FIG. 3) may recognize that a second cover for a camera is mounted through the second identification pattern P2 and may activate a camera mode even if there is no separate user operation. For example, when the second cover device 302*a* is mounted, the electronic device 101 may activate the camera mode, and the key tops 323*c* of the second cover device 302*a* may be assigned with a focus adjustment function, a shutter operation function, a shutter speed adjustment function, an aperture adjustment function, a brightness correction function, an image capture mode-switching function, and the like.

Figure 11:
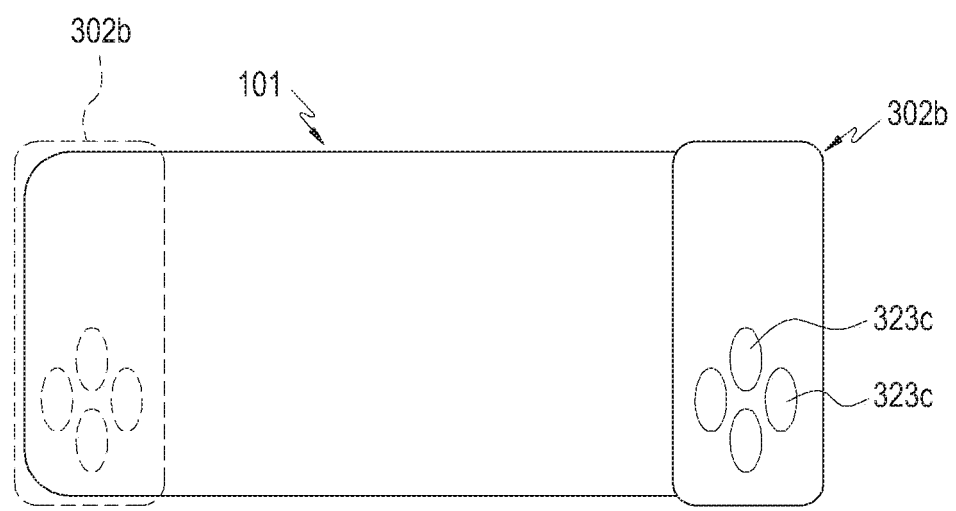
Figure 12:
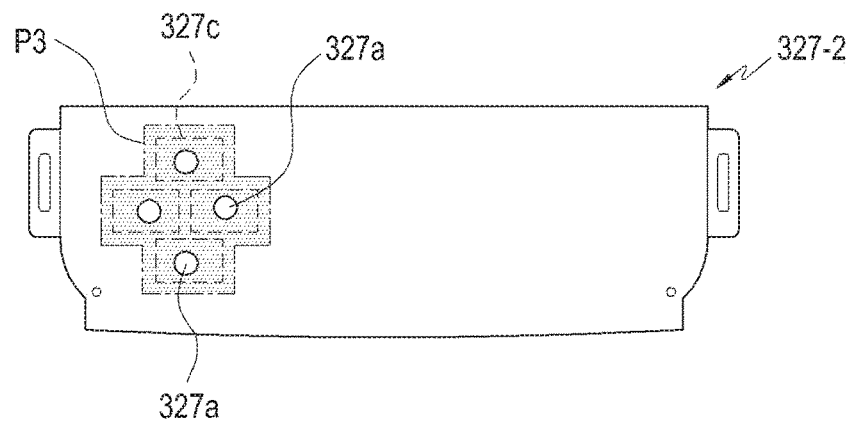

Referring to FIGS. 11 and 12, the second cover device 302*b* may be conveniently used in a game mode.

The dome pads 327*a* and the conductor pads 327*c* are disposed on the printed circuit board 327-2 of the second cover device 302*b* to respectively correspond to each other, and the conductor pads 327*c* may have an arrangement (hereinafter, referred to as a "third identification pattern P3") which is different from the above-described first identification pattern P1 and/or second identification pattern P2). When the second cover device 302*b* is mounted, the electronic device 101 may recognize that a second cover for a game is mounted through the third identification pattern P3, and may activate a game mode or may output, on a screen, a game list or the like incorporated therein even if there is no separate user operation. When the electronic device 101 activates the game mode, the key tops 323*c* of the second cover device 302*b* may be assigned with functions for executing actions of a character or the like in the game mode (e.g., an upward, downward, leftward, and rightward movement key, a first selection key, a second selection key, etc.). When the second cover device 302*b* is configured for a game mode, the second cover device 302*b* may be mounted on each of the opposite ends of the electronic device 101 (e.g., the upper and lower ends in the electronic device 101 of FIG. 3).

Figure 13:
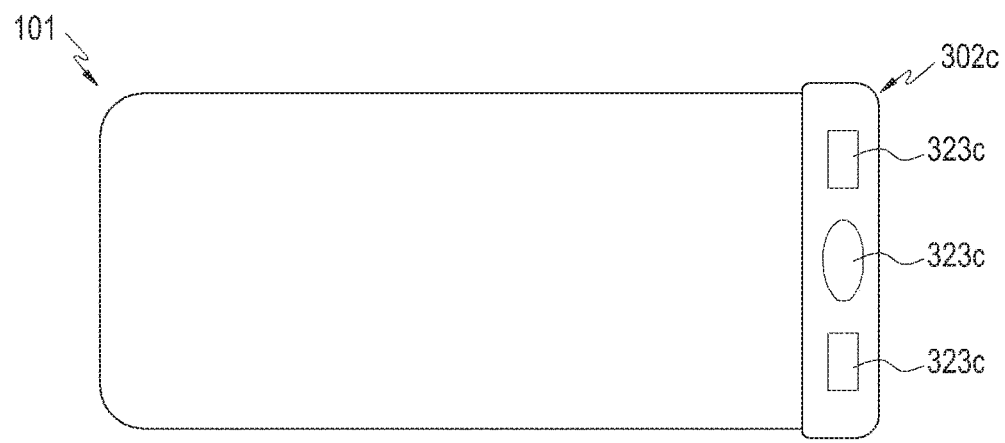
Figure 14:
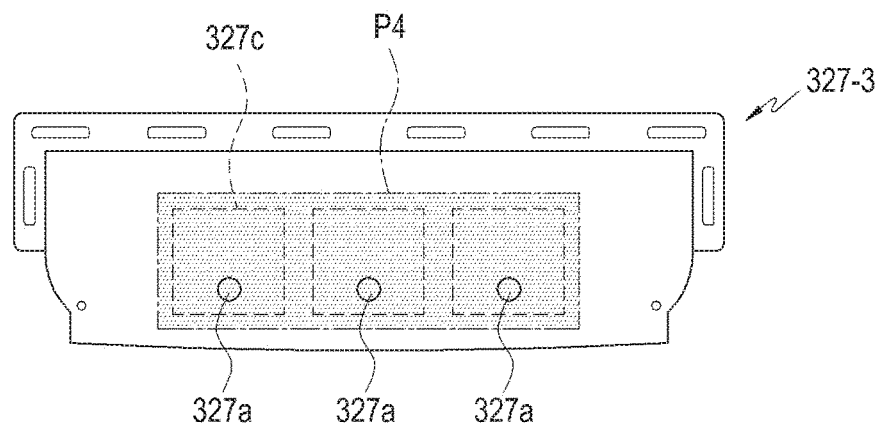

Referring to FIGS. 13 and 14, the second cover device 302*c* may be conveniently used in a multimedia mode.

According to various embodiments, the dome pads 327*a* and the conductor pads 327*c* are disposed on the printed circuit board 327-3 of the second cover device 302*c* to respectively correspond to each other, and the conductor pads 327*c* may have an arrangement (hereinafter, referred to as a "fourth identification pattern P4") which is different from the above-described identification patterns (e.g., the identification patterns P1, P2, and P3 of FIGS. 8, 10, and 12). When the second cover device 302*c* is mounted, the electronic device 101 may recognize that a second cover for a multimedia is mounted through the fourth identification pattern P4, and may activate a multimedia mode or may output, on a screen, a multimedia file list, a streaming service list, or the like even if there is no separate user operation. When the multimedia mode of the electronic device 101 is activated, the key tops 323*c* of the second cover device 302*c* may be assigned with functions suitable for the multimedia mode, such as a reproduction/pause function, a selection of music function, a reproduction list shift function, etc. When the second cover device 302*c* is mounted, the electronic device 101 may activate a basic mode, and the key tops 323*c* of the second cover device 302*c* may be assigned with a home call function, a previous screen shift function, a set menu calling function, an application drawer calling function, and the like.

A cover device detachably mounted on an electronic device may include a case member detachably provided on the electronic device, a printed circuit board, one or more key tops disposed on one face of the printed circuit board and exposed to the outside through the case member, and a plurality of conductor pads disposed on the other face of the printed circuit board such that some of the conductor pads correspond to the one or more key tops. At least one of the number, shape, and arrangement of the conductor pads corresponds to identification information of the cover device.

The cover device may include a plurality of dome pads and a plurality of metal domes, which are formed on the other face of the printed circuit board, the cover device may further include a dome sheet attached to the one face of the printed circuit board, and the metal domes may be disposed each to correspond to one of the dome pads so as to form a plurality of dome switches.

The cover device may further include via holes formed in the printed circuit board and the dome pads may be connected to one of the conductor pads through at least one of the via holes.

The cover device may further include a magnetic body mounted on the printed circuit board.

The conductive pads described above may cause a change in capacitance in the electronic device according to an actual user operation, and a configuration is exemplified in which an identification pattern (e.g., a conductor pattern) is formed using the arrangement thereof. However, the disclosure is not limited thereto, and an identifier for the type of the second cover device described above may be provided in various forms. For example, the identification chip referred to in FIG. 4 may be disposed in the second cover device to provide an identifier to the electronic device. When it is possible to arrange conductor pads in a row-column arrangement of n*m (where "n" and "m" are natural numbers) in a printed circuit board (e.g., the printed circuit board 327 of FIG. 8), the conductor pads, which are assigned with actual user operation and input functions are arranged in the row-column arrangement of n*(m−2), and conductor patterns may be selectively arranged in the remaining row*column in order to form an identification pattern. It is also possible to provide an identifier as to the type or function of the second cover device described above according to a combination of actual placement and non-placement of the conductor pads at a plurality of different positions (e.g., a 1*1 position and a 5*2 position).

In addition, the cover device may be configured to provide information (e.g., the above-described "identifier") that can be identified by the electronic device on the basis of the number, shape, arrangement, etc. of conductor patterns (e.g., conductor pads), and respective conductor pads may be combined with the display device of the electronic device so as to provide an input function.

Figure 15:
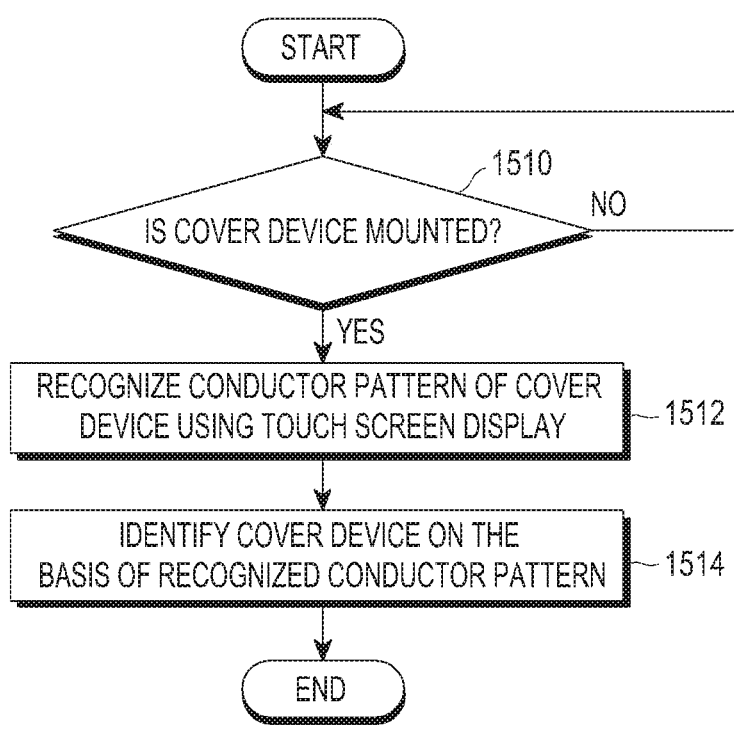
FIG. 15 is a flowchart illustrating operations for identifying a cover device mounted on an electronic device according to an embodiment of the disclosure.

FIG. 15 is a flowchart illustrating operations for identifying a cover device mounted on an electronic device according to an embodiment of the disclosure.

Referring to FIG. 15, in operation 1510, the electronic device 101 may determine whether a cover device is mounted. The electronic device 101 (e.g., the processor 120) may determine a cover device 302 (e.g., a front cover) that is mounted on a touch screen display (e.g., the display device 160). The electronic device 101 (e.g., the processor 120) may determine whether a cover device 302 (e.g., a front cover) is mounted on a touch screen display (e.g., the display device 160) on the basis of at least a part of the position, size, intensity, or polarity distribution of a magnetic body (e.g., the second magnetic body 329) included in the cover device 302 (e.g., the front cover) mounted on the touch screen display (e.g., the display device 160). When it is determined that the cover device 302 is mounted, the electronic device 101 (e.g., the processor 120) may activate the NFC module 230. The electronic device 101 may be provided with a sensor module 176 having at least one sensor that detects the condition of the electronic device 101 and the detachment and attachment of the cover device 302. For example, the sensor module 176 may include a Hall sensor capable of sensing the detachment and attachment of a cover device (e.g., a front cover and/or a rear cover). The sensor module 176 may generate a signal corresponding to the determination of mounting of the cover device and may transmit the signal to the processor 120. Various sensors included in the sensor module 176 may be added or deleted depending on the performance of the electronic device 101.

The electronic device 101 may detect whether the cover device is attached to the front face of the electronic device 101 or the rear face of the electronic device 101 using at least one of the Hall sensor or the NFC. When the cover device is mounted, the processor 120 may determine whether the attached cover device is attached to the rear face of the electronic device using the NFC. The cover device may include a communication circuit (e.g., an identification chip 313b) embedded therein and including its own unique identifier. The processor 120 may communicate with the communication circuit (e.g., identification chip 313b) embedded in the cover device using NFC so as to determine the attached cover device. For example, the processor 120 may use the identification information of the cover device, which is received using the NFC, so as to confirm whether the cover is a cover usable for the electronic device 101 (e.g., a dedicated cover).

The electronic device 101 may scan a touch screen display (e.g., the display device 160). When it is determined that the cover device 302 (e.g., the front cover) is mounted on the touch screen display (e.g., display device 160), the electronic device 101 (e.g., the processor 120) may scan the touch screen display (e.g., the display device 160). The touch screen display (e.g., the display device 160) may display various objects (e.g., a text, an image, a video, an icon, a symbol, etc.) to the user. The touch screen display (e.g., the display device 160) may sense a touch, a gesture, proximity, or hovering input using an electronic pen or a portion of the user's body.

In operation 1512, the electronic device 101 may recognize a conductor pattern of the mounted cover device 302 by scanning the touch screen display (e.g., the display device 160) on which the cover device is mounted. The electronic device 101 (e.g., the processor 120) may recognize a conductor pattern included in the cover device 302. The electronic device 101 may recognize the conductor patterns included in the cover device 302 by scanning the touch screen display. According to one embodiment, the electronic device may compare the scanned conductor patterns with pre-stored conductor patterns. The conductor patterns may have different patterns depending on the type, arrangement, use purpose, or shape of the cover device 302. Information on the conductor patterns may be stored in the memory 130 in advance. The memory 130 may store information on at least one cover device. The memory 130 may store information on at least one of a shape and region of conductor patterns for at least one cover device 302, and a position, size, intensity, or polarity distribution of the magnetic body attached to the at least one cover device.

In operation 1514, the electronic device 101 may identify the cover device on the basis of the recognized conductor pattern. According to one embodiment, the electronic device 101 may identify the cover device 302 mounted on the touch screen display on the basis of the recognized conductor pattern. The electronic device 101 may receive an identifier from the mounted cover device and may identify the cover device on the basis of the received identifier. The electronic device 101 may identify the cover device 302 on the basis of at least a part of the shape and arrangement of a conductor pattern of the cover device 302, and the number, shape, arrangement or region of the conductor pads included in the conductor pattern, and may further receive a user input on the basis of the conductor pattern. The electronic device 101 may sense (calculate) the center point of the region of the conductor pattern of the mounted cover device 302 on the basis of the outer boundary of the conductor pattern, may calculate the center point of the region of the sensed (or calculated) conductor pattern, and may calculate the position of the center point of the conductor pattern region or the distance between the center point of the conductor pattern region and a predetermined point so as to identify the cover device 302.

The electronic device 101 may recognize the magnetic body attached to the mounted cover device 302 and, when the magnetic body is recognized, the electronic device 101 may identify the front cover on the basis of the conductor pattern. The electronic device 101 may recognize at least one of the position, size, intensity, or polarity distribution of the magnetic body attached to the mounted cover device 302, and may identify the cover device 302 on the basis of the at least one of the recognized ones. Conventionally, since the rear cover attached to the electronic device provides pairing with only one front cover, it is necessary to replace the rear cover when replacing the front cover. However, according to the disclosure, since it is possible to identify various front covers through one rear cover, unnecessary expenditure according to the replacement of the rear cover can be prevented, and there is no inconvenience to separately keep the rear cover that was used previously.

The electronic device 101 may display a screen to correspond to the determined cover device. The electronic device 101 may configure and display a screen of the display device to correspond to the determined cover device 302. The electronic device 101 may configure a screen that is currently displayed on the display device 160 according to the type or shape of the cover device 302, and may display the configured screen on the touch screen display. The electronic device 101 may control the touch screen display in such a manner that the currently displayed screen is displayed on the remaining portion except for the portion covered by the cover device 302.

The electronic device 101 (e.g., the processor 120) may configure a screen in such a manner that the current screen of the touch screen display is displayed on the remaining region except for the region of the cover device. When the cover device 302 is attached to the front face of the electronic device 101, the electronic device 101 may configure a screen to fit the remaining region by adjusting at least one of the size and layout of the displayed screen. The electronic device 101 (e.g., the processor 120) may configure a screen by differently adjusting at least one of the size and layout of the current screen according to at least a part of the type of the screen displayed on the touch screen display and the type or shape of the cover device 302. According to one embodiment, the electronic device 101 may display the configured screen in the remaining region. The electronic device 10 may control the touch screen display in such a manner that the configured screen is displayed in the remaining region of the touch screen display. The electronic device may control the touch screen display in such a manner that the configured screen is displayed in the remaining region of the touch screen display as the electronic device 101 tilts to the left side or right side.

Figure 16:
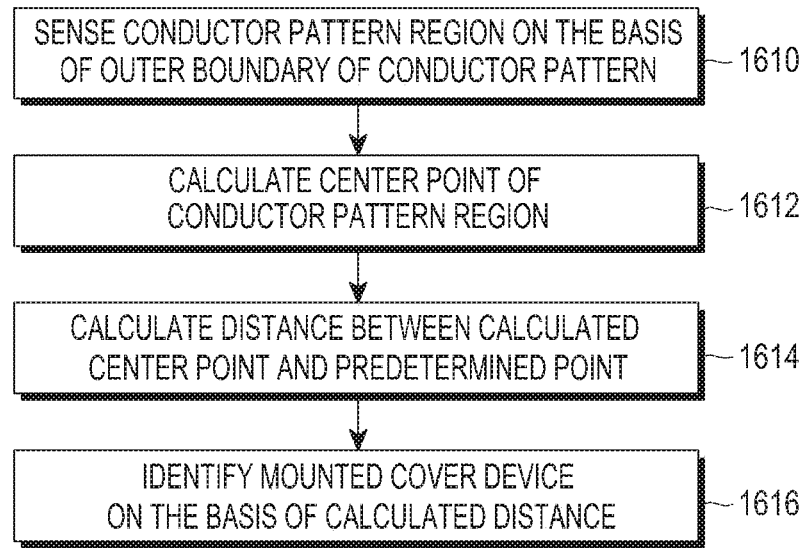
FIG. 16 is a flowchart illustrating operations for identifying a cover device mounted on an electronic device according to an embodiment of the disclosure, on the basis of a conductor pattern of the cover device.

FIG. 16 is a flowchart illustrating operations for identifying a cover device mounted on an electronic device according to an embodiment of the disclosure, on the basis of a conductor pattern of the cover device.

Referring to FIG. 16, in operation 1610, the electronic device 101 may recognize the mounting of the cover device and may sense (or calculate) the region of the conductor pattern on the basis of the outer boundary of the conductor pattern of the recognized cover device 302. When the cover device 302 is mounted, the electronic device 101 (e.g., the processor 120) may scan a touch screen display (e.g., the display device 160), and may recognize the conductor pattern of the mounted cover device 302. The electronic device 101 may determine the outer boundary of the recognized conductor pattern, and may sense (or calculate) the region of the conductor pattern formed by the determined outer boundary. The electronic device 101 may sense the region of the conductor pattern on the basis of a change rate in sensitivity of the touch screen display due to the conductor pattern.

In operation 1612, the electronic device 101 may calculate the center point of the conductor pattern region. The electronic device 101 may sense the conductor region and may calculate a center point in the conductor region on the basis of the sensed region. The center point may be used to identify the cover device 302 and may have different values depending on the type of the cover device 302. The center point may include coordinate (X, Y) values of the touch screen display (e.g., the display device 160) for the conductor region.

In operation 1614, the electronic device 101 may calculate the distance between the calculated center point and a predetermined point. The electronic device may calculate the position of the center point of a conductor pattern region or a distance between the center point of the conductor pattern region and a predetermined point. The electronic device 101 may calculate the distance between the calculated center point and the predetermined point using the coordinate (X, Y) values for the calculated center point and the coordinate (X, Y) values for the predetermined point. The calculated distance may be used to identify the cover device 302 and may have different values depending on the type of the cover device 302.

In operation 1616, the electronic device 101 may identify the cover device on the basis of the calculated distance. The electronic device 101 may identify the cover device 302 on the basis of the distance calculated using the coordinate (X, Y) values for the calculated center point and the coordinate (X, Y) values for the predetermined point. The memory 130 may store information on a plurality of cover devices 302 having different coordinate (X, Y) values for predetermined points. The memory 130 may store information on a plurality of cover devices having different distances between coordinate (X, Y) values for the center points of the cover devices and coordinate (X, Y) value for predetermined points. The electronic device 101 may identify the cover device on the basis of the calculated distances and the information pre-stored in the memory 130.

Figure 17:
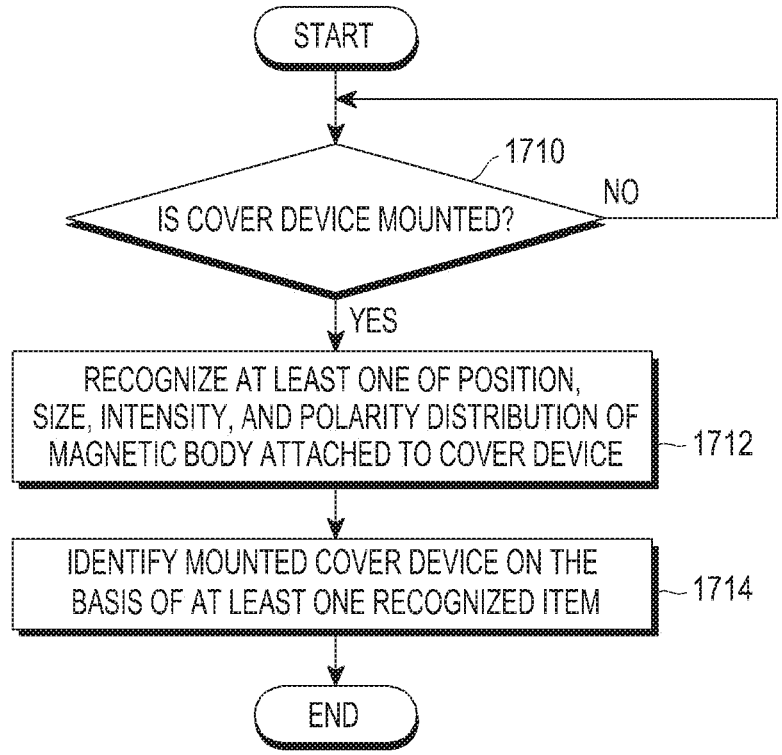
FIG. 17 is a flowchart illustrating operations for identifying a cover device mounted on an electronic device according to an embodiment of the disclosure, on the basis of a magnetic body of the cover device.

FIG. 17 is a flowchart illustrating operations for identifying a cover device mounted on an electronic device according to an embodiment of the disclosure, on the basis of a magnetic body of the cover device.

Referring to FIG. 17, in operation 1710, the electronic device 101 may determine whether a cover device is mounted. The electronic device 101 (e.g., the processor 120) may determine whether the cover device 302 (e.g., the front cover) is mounted on a touch screen display (e.g., the display device 160). The electronic device 101 may determine whether a cover device 302 is mounted on the touch screen display on the basis of at least one of the position, size, intensity, or polarity distribution of a magnetic body (e.g., the second magnetic body 329) included in the cover device 302 (e.g., the front cover) mounted on the touch screen display (e.g., the display device 160). When it is determined that the cover device is mounted, the electronic device 101 may activate the NFC module 230. The electronic device 101 may be provided with a sensor module 176 having at least one sensor that detects the condition of the electronic device 101 and the detachment and attachment of the cover device. For example, the sensor module 176 may include a Hall sensor capable of sensing the detachment and attachment of a cover device (e.g., a front cover and/or a rear cover). The sensor module 176 may generate a signal corresponding to the determination of mounting of the cover device and may transmit the signal to the processor 120. Various sensors included in the sensor module 176 may be added or deleted depending on the performance of the electronic device 101.

In operation 1712, the electronic device 101 may recognize at least one of the position, size, intensity, and polarity distribution of the magnetic body attached to the cover device. The electronic device 101 may recognize at least one of the position, size, intensity, and polarity distribution of the magnetic body attached to the cover device in order to identify the cover device. The electronic device 101 may sense a change of Hall signal (e.g., Hall voltage) according to the position, size, intensity, or polarity distribution of the magnetic body attached to the cover device, through a Hall sensor included in the sensor module 176 of the electronic device 101.

In operation 1714, the electronic device 101 may identify the mounted cover device on the basis of the at least one recognized item. The electronic device 101 may identify the cover device by recognizing at least one of the position, size, intensity, and polarity distribution of the magnetic body attached to the cover device. According to one embodiment, the electronic device 101 may identify the cover device by sensing a change of Hall signal (e.g., Hall voltage) according to the position, size, intensity, or polarity distribution of the magnetic body attached to the cover device, through a Hall sensor included in the sensor module 176 of the electronic device 101. The memory 130 may store information on a plurality of cover devices having different information (or values) on the position, size, intensity, or polarity distribution of a magnetic body attached to each of the cover devices. The memory 130 may store information on a plurality of cover devices which are different from each other in terms of Hall signal (e.g., Hall voltage) being sensed by a Hall sensor included in the sensor module 176 of the electronic device 101 according to the position, size, intensity, or polarity distribution of the magnetic body attached to the cover device. The electronic device 101 may identify the cover device on the basis of at least some of the position, magnitude, intensity, and polarity distribution of the magnetic body attached to the cover device, and information (or a value) previously stored in the memory.

Figure 18:
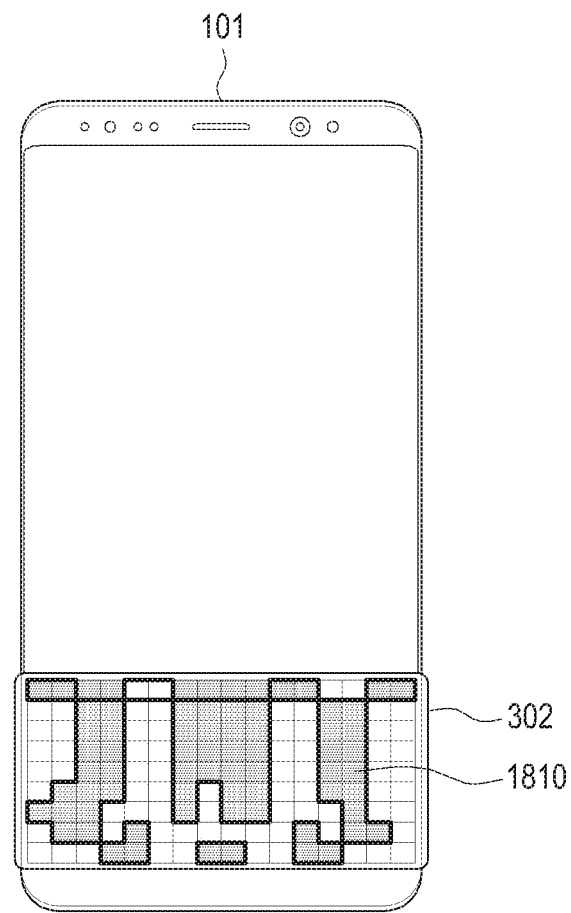
FIG. 18 is a view illustrating the sensitivity of a display device on the basis of a cover device mounted on a display device of an electronic device according to an embodiment of the disclosure.

FIG. 18 is a view illustrating the sensitivity of a touch screen display of an electronic device according to an embodiment of the disclosure on the basis of a cover device mounted on the touch screen display.

Referring to FIG. 18, the touch screen display (e.g., the display device 160) of the electronic device 101 may have sensitivity according to a predetermined unit (e.g., a touch point, a touch point group, or the like). When the cover device 302 is attached to the touch screen display having a sensitivity value according to the predetermined unit (e.g., a touch point or a touch point group), the sensitivity value at the predetermined unit (e.g., a touch point or a touch point group) may be changed. The electronic device 101 (e.g., the processor 120) may recognize a conductor pattern 1810 of the cover device 302 using a change rate in sensitivity at the predetermined unit that changes as the cover device 302 is attached to the touch screen display. The electronic device 101 may identify the cover device 302 on the basis of a change rate in sensitivity (or a change amount) at a predetermined unit of the touch screen display that is changed by the conductor pattern 1810 included in the cover device 302 mounted on the touch screen display. The electronic device 101 may identify the cover device 302 by detecting the conductor pattern 1810 of the mounted cover device 302. The electronic device 101 may identify the cover device 302 by calculating the region of the conductor pattern 1810 on the basis of the outer boundary of the conductor pattern of the mounted cover device 302, calculating the center point of the calculated conductor pattern 1810, and calculating the distance between the calculated center point and a predetermined point.

Figure 19A:
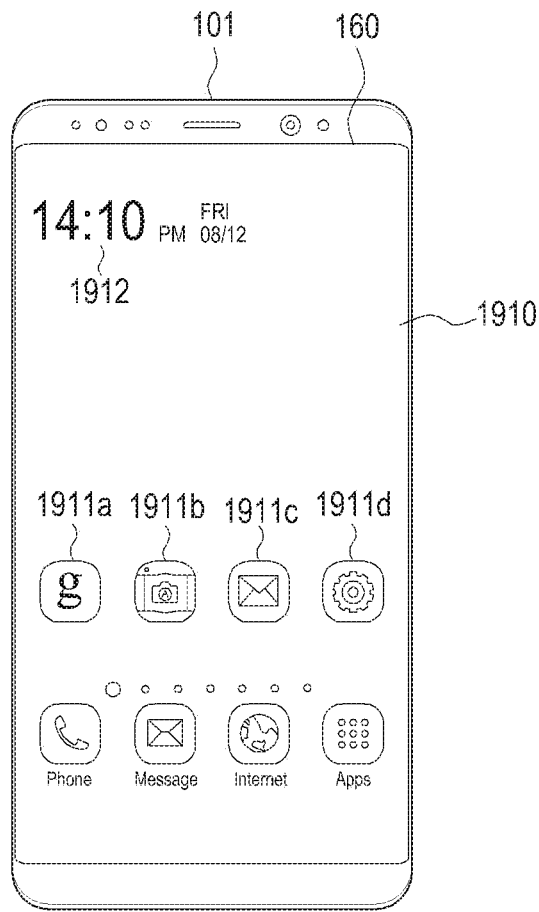
FIG. 19A is a view illustrating a main screen displayed on a display device according to an embodiment of the disclosure.
Figure 19B:
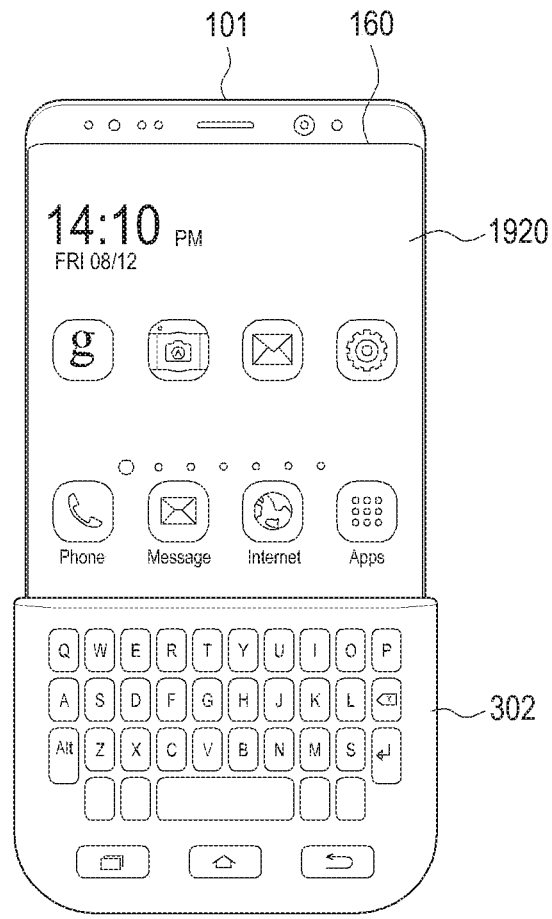
FIG. 19B is a view illustrating a screen in correspondence with the mounting of a cover device in the state in which a main screen is displayed on a display device according to an embodiment of the disclosure.
Figure 19C:
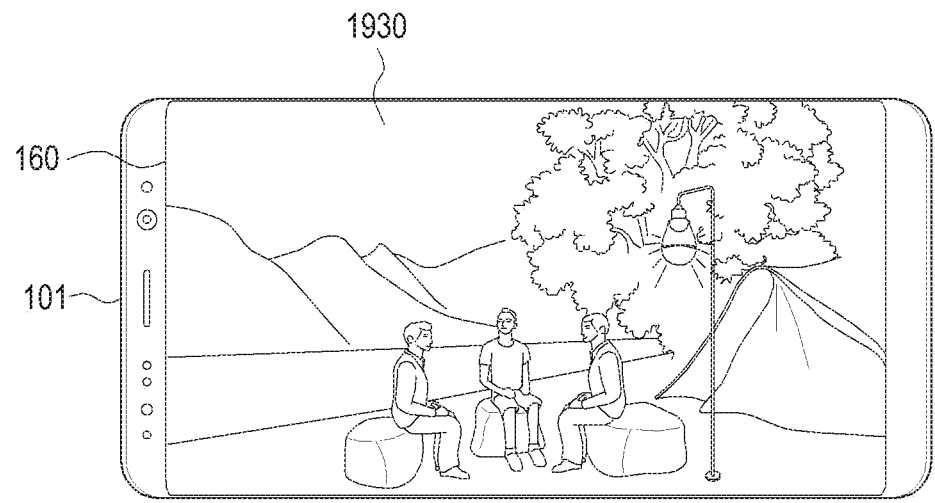
FIG. 19C is a view illustrating a state in which an electronic device according to an embodiment of the disclosure is operating in an image capture mode.
Figure 19D:
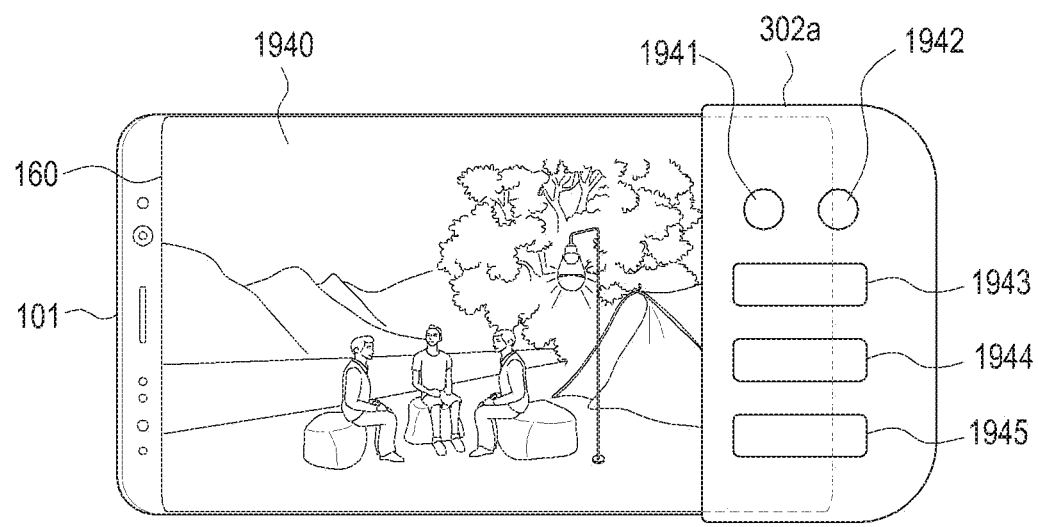
FIG. 19D is a view illustrating a screen in correspondence with the mounting of a cover device on an electronic device, which is operating in an image capture mode according to an embodiment of the disclosure.
Figure 19E:
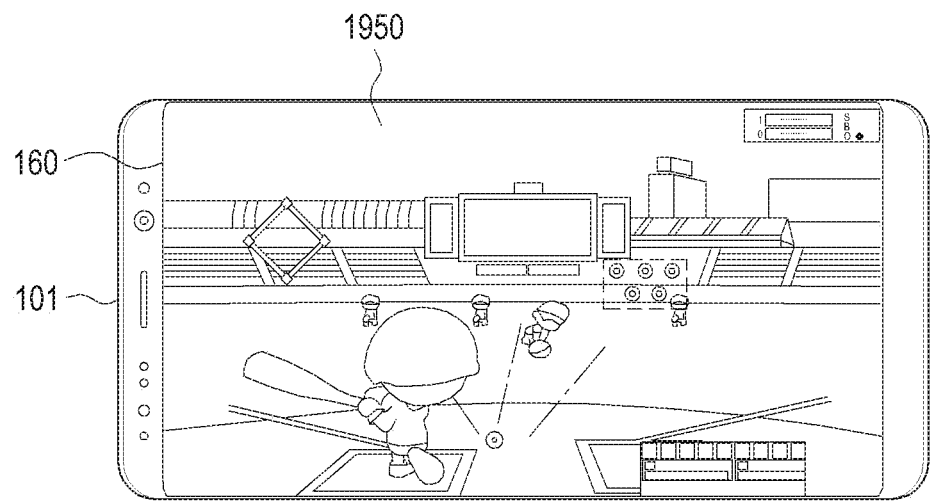
FIG. 19E is a view illustrating a state in which an electronic device according to an embodiment of the disclosure is executing a game.
Figure 19F:
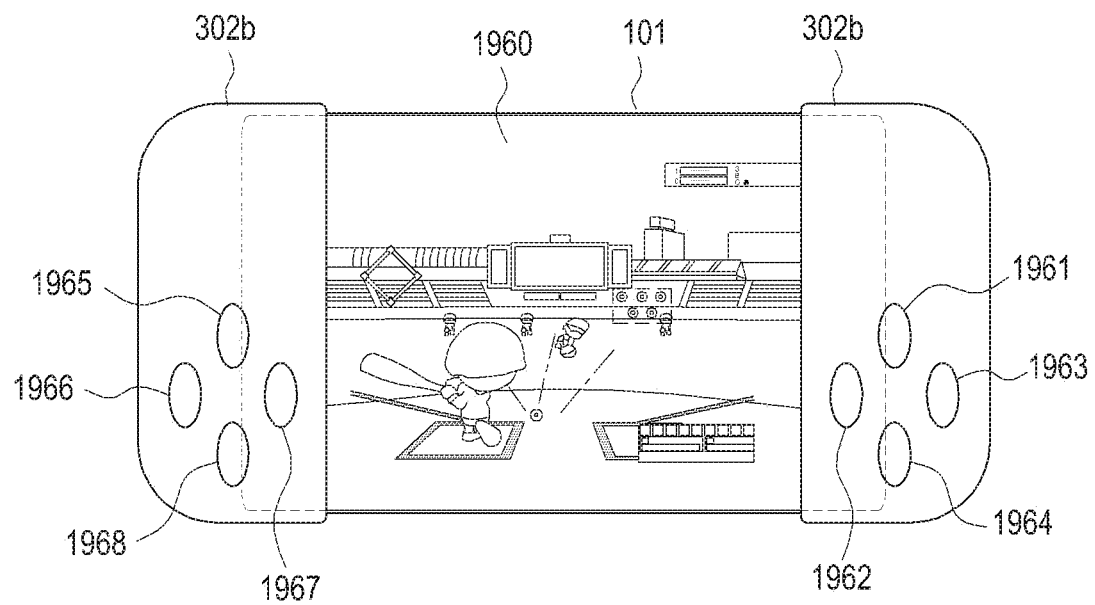
FIG. 19F is a view illustrating a screen displayed in correspondence with the mounting of a cover device on an electronic device, which is executing a game according to various embodiments of the disclosure.
Figure 19G:
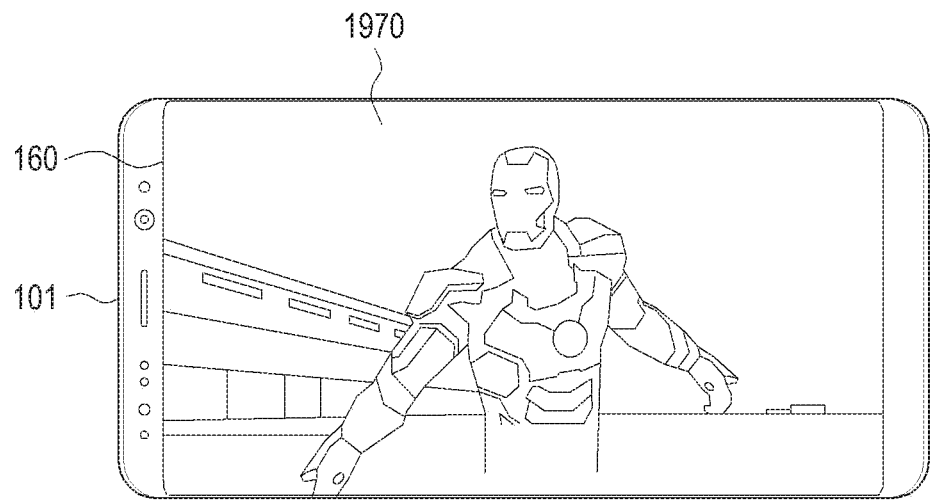
FIG. 19G is a view in which an electronic device according to an embodiment of the disclosure is reproducing a movie.
Figure 19H:
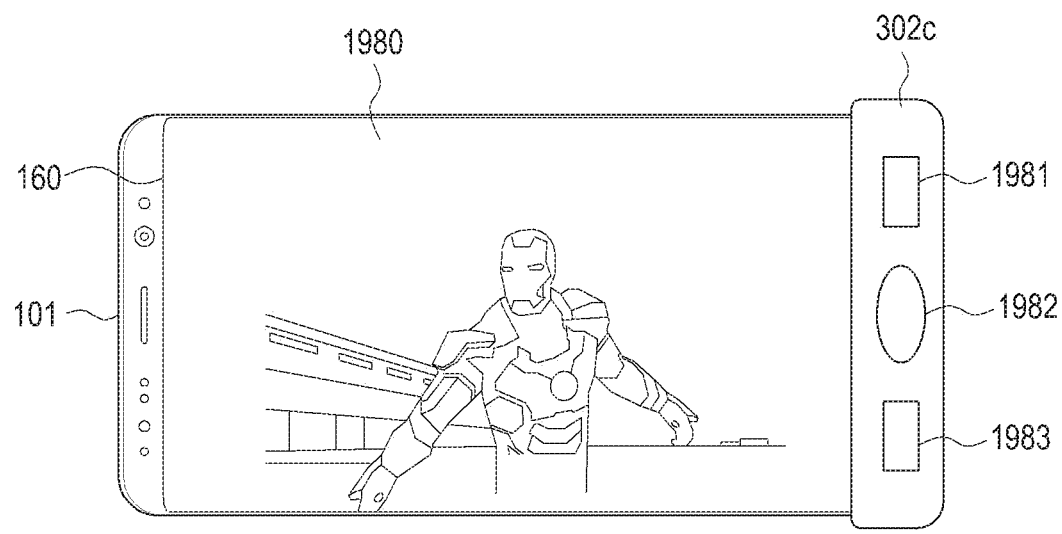
FIG. 19H is a view illustrating a screen displayed in correspondence with the mounting of a cover device on an electronic device, which is reproducing a movie according to an embodiment of the disclosure.

FIG. 19A is a view illustrating a main screen displayed on a touch screen display according to an embodiment of the disclosure, FIG. 19B is a view illustrating a screen in correspondence with the mounting of a cover device in the state in which a main screen is displayed on a touch screen display according to an embodiment of the disclosure, FIG. 19C is a view illustrating a state in which an electronic device according to an embodiment of the disclosure is operating in an image capture mode, FIG. 19D is a view illustrating a screen in correspondence with the mounting of a cover device on an electronic device according to an embodiment of the disclosure, which is operating in an image capture mode according to an embodiment of the disclosure, FIG. 19E is a view illustrating a state in which an electronic device according to an embodiment of the disclosure is executing a game according to an embodiment of the disclosure, FIG. 19F is a view illustrating a screen displayed in correspondence with the mounting of a cover device on an electronic device, which is executing a game according to an embodiment of the disclosure, FIG. 19G is a view in which an electronic device according to an embodiment of the disclosure is reproducing a movie, and FIG. 19H is a view illustrating a screen displayed in correspondence with the mounting of a cover device on an electronic device, which is reproducing a movie according to an embodiment of the disclosure.

Referring to FIGS. 19A and 19B, the electronic device 101 may display a screen 1910 on a touch screen display (e.g., display device 160). The screen 1910 may be a background screen of the electronic device 101 and may display a plurality of icons 1911a to 1911d and a clock 1912. In this state, when the cover device 302 (e.g., the front cover) is mounted on the touch screen display of the electronic device 101, the electronic device 101 may sense the mounting of the cover device 302 and may configure a screen in such a manner that the screen 1910 illustrated in FIG. 19A can be displayed to correspond to the mounting of the cover device 302. The electronic device 101 may configure the screen 1910 in such a manner that a region covered by the cover device 302 does not occur in the display region of the touch screen display, and may display the configured screen 1920 on the touch screen display. The electronic device 101 may delete the icons, information, and the like that may not be provided to the user, or may reduce the sizes thereof. The electronic device 101 may adjust the layout displayed in order to configure a screen. The electronic device 101 may sense an input by at least one key configured in the cover device, and may execute the corresponding function in response to the sensing. The cover device 302 may include a keypad formed as a qwerty keyboard. The cover device 302 may include a cover device including a keypad formed a keypad formed as a QWERTY keyboard, a 3×4 array keypad, a keypad including a qwerty keyboard and a function key, a keypad including a game operation key for game operation, a touch pad touchable using an external device, or the like.

Referring to FIGS. 19C and 19D, the electronic device 101 may capture an image. When the electronic device 101 performs an image capture mode, the electronic device 101 may display a preview image 1930 on a touch screen display (e.g., the display device 160). The preview image 1930 may include an image currently acquired through the camera module 180 of the electronic device 101. The electronic device 101 may sense the attachment of the cover device 302a for controlling image capture. The cover device 302a may include a plurality of buttons (e.g., buttons 1941, 1942, 1943, 1944, and 1945) for providing various functions according to the image capture mode. The electronic device may sense input made via at least one of the buttons 1941, 1942, 1943, 1944, and 1945 provided in the cover device 302a. The electronic device 101 may operate in response to input made via at least one of the buttons 1941, 1942, 1943, 1944, and 1945 provided in the cover device 302a. At least one of the buttons 1941, 1942, 1943, 1944, and 1945 may be assigned with functions such as a focus adjustment function, a shutter operation function, a shutter speed adjustment function, an aperture adjustment function, a brightness correction function, an image capture mode switching function, etc.

The electronic device 101 may configure a screen in such a manner that, when the attachment of the cover device 302a is sensed in the state in which a preview image 1930 is displayed on the touch screen display, the displayed preview image 1930 can be displayed to correspond to the mounting of the cover device 302a. The electronic device 101 may display the configured screen 1940 on the touch screen display. The electronic device 101 may configure the preview screen 1930 in such a manner that a region covered by the cover device 302a does not occur in the display region of the touch screen display, and may display the configured preview image 1940 on the touch screen display.

Referring to FIGS. 19E and 19F, the electronic device 101 may execute a game. When the electronic device 101 executes a game, the electronic device 101 may display an executed game screen 1950 on the touch screen display. The game screen 1950 may include an image of the current screen of the game executed by the electronic device 101. The electronic device 101 may sense the attachment of a cover device 302b for controlling the executed game. The cover device 302b may include a plurality of buttons 1961, 1962, 1963, 1964, 1965, 1966, and 1968 for providing various functions for controlling the game. The cover device 302b may include two cover devices, which may be respectively attached to the left and right sides of the electronic device 101 placed transversely. The electronic device 101 may sense input made via at least one of the buttons 1961, 1962, 1963, 1964, 1965, 1966, 1967, and 1968 provided in the cover device 302b. According to one embodiment, the electronic device 101 may operate in response to input made via at least one of the buttons provided in the cover device 302b. The buttons 1961, 1962, 1963, 1964, 1965, 1966, and 1968 may be respectively assigned with functions for executing the actions of a character or the like in a game mode (e.g., an upward, downward, leftward, and rightward movement key, a first selection key, and a second selection key).

The electronic device 101 may configure a screen in such a manner that, when the attachment of the cover device 302b is sensed in the state in which the game screen 1950 is displayed on the touch screen display, the displayed game screen 1950 can be displayed to correspond to the mounting of the cover device 302b. The electronic device 101 may display the configured game screen 1960 on the touch screen display. The electronic device 101 may configure the game screen 1950 in such a manner that a region covered by the cover device 302b does not occur in the display region of the touch screen display (e.g., the display device 160), and may display the configured game screen 1950 on the touch screen display (e.g., the display device 160).

Referring to FIGS. 19E and 19F, the electronic device 101 may reproduce a movie. When the electronic device 101 reproduces a movie, the electronic device 101 may display a reproduced movie scene 1970 on the touch screen display. The movie scene 1970 may include an image for the current scene of the movie reproduced by the electronic device 101. The electronic device may sense the attachment of a cover device 302c for controlling the reproduced movie. The cover device 302c may include a plurality of buttons 1981, 1982, and 1983 for providing various functions for controlling the reproduced movie. The electronic device 101 may sense input made via at least one of the buttons 1981, 1982, and 1983 provided in the cover device 302c. The electronic device 101 may operate in response to input made via at least one of the buttons 1981, 1982, and 1983 provided in the cover device 302c. The buttons 1981, 1982, and 1983 may be respectively assigned with functions suitable for multimedia mode (e.g., a reproduction/pause function, a selection function, a reproduction list shift function, a home call function, a previous screen shift function, a set menu call function, an application drawer call function, etc.). At least one of the buttons 1981, 1982, 1983 may be assigned with at least one function specific to a movie (e.g., a reproducing function, a pause function, a temporary pause function, a quick reproducing function of a movie, or the like).

The electronic device 101 may configure a movie scene in such a manner that, when the attachment of the cover device 302c is sensed in the state in which the movie scene 1970 is displayed on the touch screen display, the displayed movie scene 1970 can be displayed to correspond to the mounting of the cover device 302c. Then, the electronic device 101 may display the configured movie scene 1980 on the touch screen display. The electronic device 101 may configure a movie scene 1980 in such a manner that a region covered by the cover device 302c does not occur in the display region of the touch screen display, and may display the configured movie scene 1980 on the touch screen display. The electronic device 101 may configure a screen to fit the remaining region by adjusting at least one of the size and the layout of the movie scene 1970. The electronic device 101 may adjust at least one of the size and layout of the current movie scene 1970 differently according to at least a part of the type of the movie scene 1970 displayed on the touch screen display, and the type or shape of the cover device 302c, and may reproduce the adjusted movie screen 1980.

According to various embodiments of the disclosure, the electronic device 101 may provide a home-key and a back-key configuration on the cover device 302c. The electronic device 101 may reproduce a movie. When the electronic device 101 reproduces a movie, one of a movie pausing function, a home screen shift function, etc. may be performed using the at least one of the buttons (e.g., the buttons 1981, 1982, and 1983). Since the user may use a phone as in the terminal including the keys, convenience can be provided to the user.

The electronic device 101 of the disclosure may include: a housing; a wireless communication circuit 192 disposed within the housing; a touch screen display (e.g., the display device 160) exposed to the outside; and a processor 120 disposed in the housing and electrically connected to the wireless communication circuitry 192 and the touch screen display. The processor may be set to sense the mounting of the cover device 302 on the touch screen display, to determine the conductor pattern of the mounted cover device 302 by scanning the touch screen display on which the cover device 302 is mounted, and to identify the mounted cover device 302 on the basis of the determined conductor pattern.

The processor 120 may be set to identify the mounted cover device 302 on the basis of at least a part of the number, shape, arrangement, and a region of conductor patterns included in the conductor pattern of the cover device 302 and to further receive a user input on the basis of the conductor pattern.

The processor 120 may be set to sense a conductor pattern region on the basis of the outer boundary of the conductor pattern of the mounted cover device 302 to calculate the center point of the sensed conductor pattern region, to calculate the position of the center point of the calculated conductor pattern region or the distance between the center point of the conductor pattern region and a predetermined point, and thereby to identify the cover device 302.

The processor 120 may be set to recognize the magnetic body attached to the mounted cover device 302 and to identify the cover device on the basis of the conductor pattern when the magnetic body is recognized.

The processor 120 may be set to recognize at least one of the position, size, intensity, or polarity distribution of the magnetic body attached to the mounted cover device 302, and to identify the cover device 302 on the basis of the at least one of the recognized ones.

The processor 120 may be set to configure and display a screen of the display device to correspond to the identified cover device 302.

The processor 120 may be set to activate the wireless communication circuit 192 when the rear cover 301 is mounted on the electronic device 101, to determine, when a first identifier of the rear cover 301 is received from the rear cover 301 via the activated wireless communication circuit 192, whether the received first identifier is the same as the previously stored second identifier, to request information on at least one cover device 302 corresponding to the first identifier when the first identifier is not the same as the second identifier, and to store information on the at least one cover device 302, which is received in response to the request.

The information on the cover device 302 may include information on the shape and region of the conductor pattern of at least one cover device 302 that may be detachably attached to the touch screen display, and at least one of the position, size, intensity, and polarity distribution of the magnetic body attached to the at least one cover device 302.

According to one embodiment, the processor 120 may be set to identify the cover device 302 mounted on the touch screen display when the first identifier and the second identifier are the same.

Figure 20:
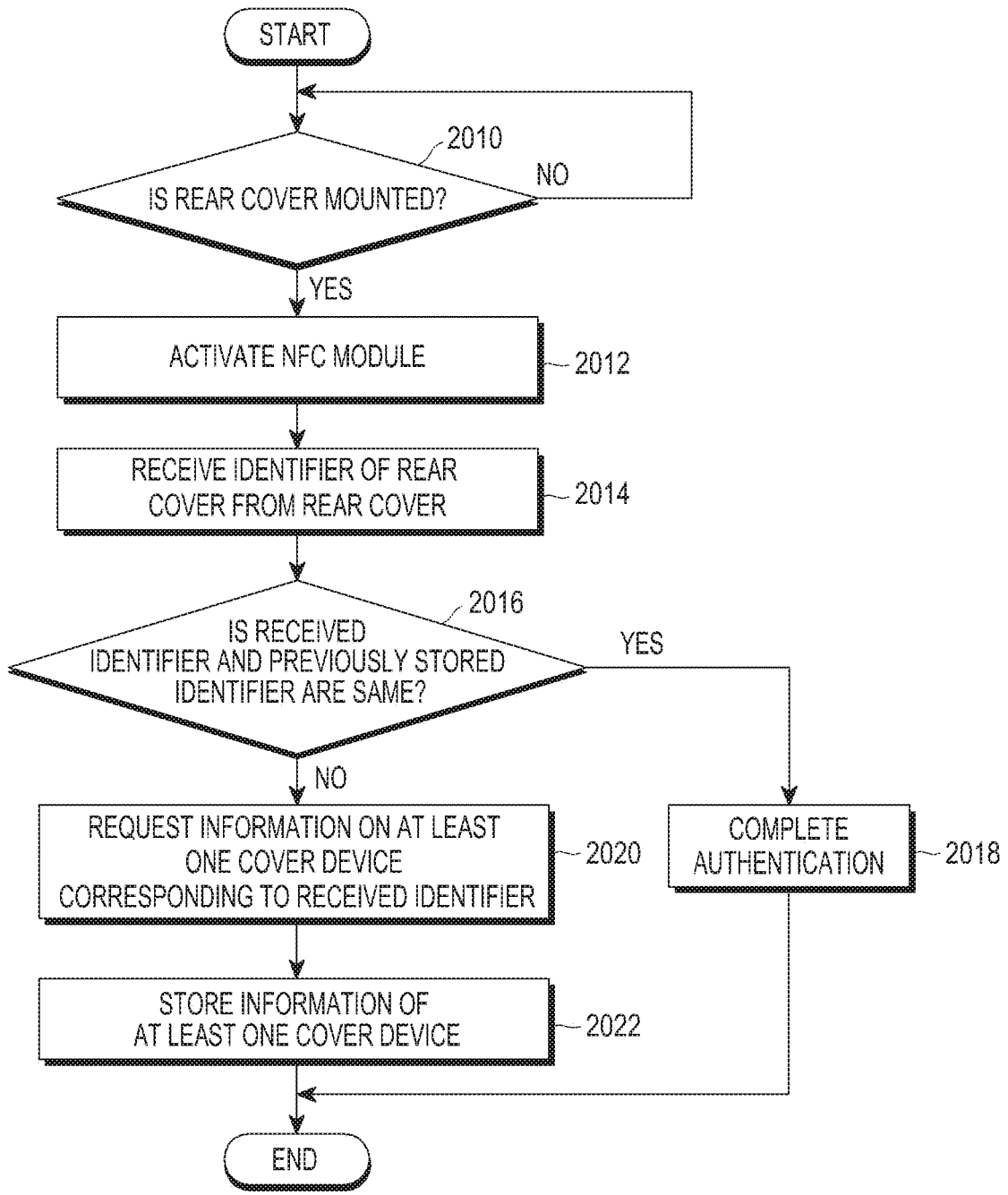
FIG. 20 is a flowchart illustrating operations for storing information on at least one cover device corresponding to a rear cover on which an electronic device according to an embodiment of the disclosure is mounted.

FIG. 20 is a flowchart illustrating operations for storing information on at least one cover device corresponding to a rear cover, on which an electronic device according to an embodiment of the disclosure is mounted.

Referring to FIG. 20, in operation 2010, the electronic device 101 may determine whether a rear cover is mounted. According to one embodiment, the electronic device 101 (e.g., the processor 120) may identify a cover device 301 (e.g., a rear cover) that is mounted on the rear face of the display device 101. When it is determined that the cover device 301 (e.g., the rear cover is mounted, the electronic device 101 may activate the NFC module 230. The electronic device 101 may include a sensor module 176 having at least one sensor that detects the state of the electronic device 101 and the detachment and attachment of the cover device 301 (e.g., the rear cover). For example, the sensor module 176 may include a Hall sensor capable of sensing the detachment and attachment of the cover device 301. The sensor module 176 may generate a signal corresponding to the determination of mounting of the cover device 301 and may transmit the signal to the processor 120. Various sensors included in the sensor module 176 may be added or deleted depending on the performance of the electronic device 101. The electronic device 101 may determine whether the cover device 301 is attached to the rear face of the electronic device 101 using a Hall sensor. The cover device 301 may have a communication circuit built therein and including its own unique identifier.

In operation 2012, the electronic device 101 may activate the NFC module. According to one embodiment, when it is determined that the cover device 301 is mounted on the rear face of the electronic device 101, the electronic device 101 may activate the NFC module 230. According to one embodiment, when at least one of the position, size, intensity, and polarity distribution of the magnetic body included in the mounted cover device 301 is recognized, the electronic device 101 may activate the NFC module 230. According to one embodiment, the electronic device 101 may perform communication with a communication circuit (e.g., an identification chip 313b) using an NFC module 230 so as to determine whether the attached cover device is a cover device 301 unique to itself.

In operation 2014, the electronic device 101 may receive an identifier of the rear cover from the rear cover. The electronic device 101 may receive information including an identifier for the cover device 301 from the identification chip 313b included in the cover device 301 via the activated NFC module 230. The electronic device 101 may receive information including an identifier for the rear cover through wireless communication or wired communication with the rear cover. The information on the rear cover may include at least one of a manufacturer name of the rear cover, whether or not the rear cover is a genuine article, a product name of the rear cover, a color of the rear cover, a type of the rear cover, an ID format, a type and arrangement information of at least one physical key provided in the rear cover, and an access address of a manufacturer web page of the rear cover.

In operation 2016, the electronic device 101 may determine whether the received identifier is the same as the previously stored identifier. When information including an identifier for the cover device 301 is received from the cover device 301 via the activated NFC module 230, the electronic device 101 may determine whether or not the identifier for the cover device 301 included in the received information is the same as the identifier previously stored in the memory 130. The electronic device 101 compares the received identifier with the previously stored identifier so as to determine whether the rear cover is a genuine product and to identify at least one of the product name, color, type and ID format of the rear cover, type and arrangement information of one or more physical keys provided on the rear cover, and the access address of the maker web page of the rear cover. When authentication of the rear cover is completed, the electronic device 101 may perform operation 2018, but when authentication of the rear cover is not completed, the electronic device 101 may perform operation 2020.

In operation 2018, the electronic device 101 may complete authentication. When it is determined that the received identifier is the same as the previously stored identifier, the electronic device 101 may complete authentication. The electronic device 101 may perform authentication of the rear cover. According to one embodiment, the electronic device 101 may perform authentication of the rear cover using the information as to whether or not the rear cover is a genuine product, which is included in the information of the rear cover.

In operation 2020, the electronic device 101 may request information on at least one cover device corresponding to the received identifier. When the mounted rear cover is an unregistered rear cover, the electronic device 101 may request information on at least one cover device corresponding to the received identifier via a network, such as the network 199 in FIG. 1. When it is determined that the identifier for the cover device 301 received from the identification chip 313b of the mounted rear cover is not the same as the identifier previously stored in the memory 130, the electronic device 101 may request information on at least one cover device corresponding to the received identifier from the server 108 via a network. When it is determined that the identifier for the cover device 301 received from the identification chip 313b of the mounted rear cover is not the same as the identifier previously stored in the memory 130, the electronic device 101 may display a warning message on the touch screen display, indicating that the rear cover is not a genuine accessory. The warning message may include a message that informs that the identifier for the cover device 301 received from the identification chip 313b of the mounted rear cover is not the same as the identifier previously stored in the memory 130, and requests reception of information on at least one cover device corresponding to the mounted rear cover. When the rear cover is not genuine, the electronic device 101 may request information on at least one cover device corresponding to the received identifier from the server 108 via a network.

In operation 2022, the electronic device 101 may store information on the at least one cover device. The electronic device 101 may request information on at least one cover device corresponding to the received identifier from the server 108, may receive information on the one cover device in response to the request, and may store the information in the memory 130. The received information may be used when the cover device (e.g., the front cover) is attached in the future. The information may include at least one of a manufacturer name of the cover device, information as to whether or not the cover device is a genuine product, a product name, a color, a type of the cover device, and an ID format of the cover device, information on the type and arrangement of at least one physical key provided in the cover device, and an access address of a manufacturer web page of the cover device.

Figure 21:
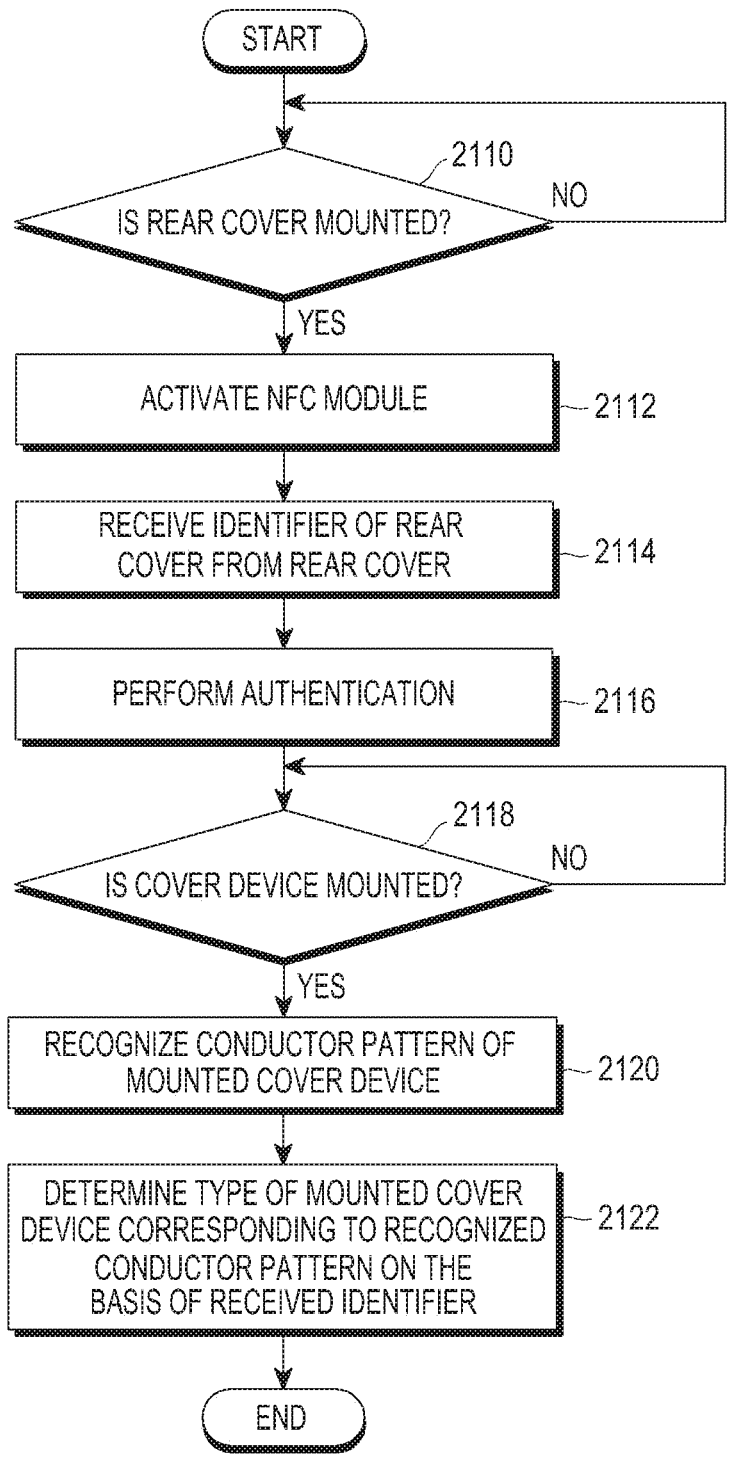
FIG. 21 is a flowchart illustrating operations for identifying a front cover in the case where a rear cover and the front cover are mounted on an electronic device according to an embodiment of the disclosure.

FIG. 21 is a flowchart illustrating operations for identifying a front cover in the case where a rear cover and the front cover are mounted on an electronic device according to an embodiment of the disclosure.

Referring to FIG. 21, in operation 2110, the electronic device 101 may determine whether a rear cover is mounted. The electronic device 101 may identify a cover device 301 (e.g., a rear cover) that is mounted on the rear face of the display device 101. When it is determined that the cover device 301 is mounted, the electronic device 101 may activate the NFC module 230. The electronic device 101 may include a sensor module 176 having at least one sensor that detects the state of the electronic device 101 and the detachment and attachment of the cover device 301 (e.g., the rear cover). For example, the sensor module 176 may include a Hall sensor capable of sensing the detachment and attachment of the cover device. The sensor module 176 may generate a signal corresponding to the determination of mounting of the cover device 301 and may transmit the signal to the processor 120. Various sensors included in the sensor module 176 may be added or deleted depending on the performance of the electronic device 101. The electronic device 101 may determine whether the cover device 301 (e.g., the rear cover) is attached to the rear face of the electronic device 101 using a Hall sensor. The cover device 301 may have a cover device (e.g., the identification chip 313b) built therein and including its own unique identifier.

In operation 2112, the electronic device 101 may activate the NFC module. According to one embodiment, when it is determined that the cover device 301 is mounted on the rear face of the electronic device 101, the electronic device 101 may activate the NFC module 230. When at least one of the position, size, intensity, and polarity distribution of the magnetic body included in the mounted cover device 301 is recognized, the electronic device 101 may activate the NFC module 230. The electronic device 101 may perform communication with a communication circuit (e.g., an identification chip 313b) embedded in the cover device 301 using an NFC module 230 so as to determine whether the attached cover device is a cover device 301 unique to itself.

In operation 2114, the electronic device 101 may receive an identifier of the rear cover from the rear cover. The electronic device 101 may receive information including an identifier for the cover device 301 from the identification chip 313b included in the cover device 301 via the activated NFC module 230. The electronic device 101 may receive information including an identifier for the rear cover through wireless communication or wired communication with the rear cover. The information on the rear cover may include at least one of a manufacturer name of the rear cover, whether or not the rear cover is a genuine article, a product name of the rear cover, a color of the rear cover, a type of the rear cover, an ID format, a type and arrangement information of at least one physical key provided in the rear cover, and an access address of a manufacturer web page of the rear cover.

In operation 2116, the electronic device 101 may perform authentication. The electronic device 101 may perform authentication as to whether the received identifier is the same as the previously stored identifier. The electronic device 101 may perform authentication of the rear cover using the information as to whether or not the rear cover is a genuine product, which is included in the information of the rear cover.

In operation 2118, the electronic device 101 may determine whether a cover device is mounted. The electronic device 101 may determine whether the cover device 302 (e.g., the front cover) is mounted on a touch screen display. The electronic device 101 may determine whether the cover device 302 is mounted on a touch screen display on the basis of at least one of the position, size, intensity, or polarity distribution of a magnetic body (e.g., the second magnetic body 329) included in the cover device 302 mounted on the touch screen display. The electronic device 101 may include a sensor module 176 having at least one sensor that detects the state of the electronic device 101 and the detachment and attachment of the cover device 302. For example, the sensor module 176 may include a Hall sensor capable of sensing the detachment and attachment of a cover device (e.g., a front cover and/or a rear cover). The sensor module 176 may generate a signal corresponding to the determination of mounting of the cover device and may transmit the signal to the processor 120.

In operation 2120, the electronic device 101 may recognize the conductor pattern of the mounted cover device. The electronic device 101 may recognize the conductor pattern included in the cover device 302. According to one embodiment, the electronic device 101 may recognize the conductor patterns included in the cover device 302 by scanning a touch screen display. The electronic device 101 may compare the scanned conductor patterns with pre-stored conductor patterns. The conductor patterns may have different patterns depending on the type, use purpose, or shape of the cover device 302. Information on the conductor patterns may be stored in the memory 130 in advance. The memory 130 may store information on at least one cover device. The memory 130 may store information on at least one of a shape and region of conductor patterns for at least one cover device 302, and a position, size, intensity, or polarity distribution of the magnetic body attached to the at least one cover device.

In operation 2122, the electronic device 101 may identify the mounted cover device corresponding to the recognized conductor pattern on the basis of the received identifier.

According to one embodiment of the disclosure, the electronic device 101 may identify the cover device 302 mounted on a touch screen display on the basis of the recognized conductor pattern. The electronic device 101 may receive an identifier from the mounted cover device and may identify the cover device on the basis of the received identifier. The electronic device 101 may identify the cover device 302 on the basis of at least a part of the shape or region of the conductor pattern of the mounted cover device 302. The electronic device 101 may identify the cover device 302 by calculating the region of the conductor pattern on the basis of the outer boundary of the conductor pattern of the mounted cover device 302, calculating the center point of the calculated conductor pattern 1810, and/or calculating the distance between the calculated center point and a predetermined point. The electronic device 101 may recognize the magnetic body attached to the mounted cover device 302 and, when the magnetic body is recognized, the electronic device 101 may identify the front cover on the basis of the conductor pattern The electronic device 101 may recognize at least one of the position, size, intensity, or polarity distribution of the magnetic body attached to the mounted cover device 302, and may identify the cover device 302 on the basis of the at least one of the recognized ones.

According to various embodiments of the disclosure, a method of identifying a cover device 302 attached to an electronic device 101 according to the disclosure may include: sensing mounting of the cover device 302 on a touch screen display of the electronic device 101; identifying a conductor pattern of the mounted cover device 302 by scanning the touch screen display on which the cover device 302 is mounted; and identifying the mounted cover device 302 on the basis of the identified conductor pattern.

The method of the disclosure may further include: identifying the cover device 302 on the basis of at least a part of the number, shape, arrangement or region of the conductor pads included in the conductor pattern of the mounted cover device 302, and receiving a user input on the basis of the conductor pattern.

The method of the disclosure may further include: identifying the cover device 302 by sensing an region of the conductor pattern on the basis of an outer boundary of the conductor pattern of the mounted cover device 302; calculating a center point of the sensed conductor pattern region; and calculating the position of the center point of the conductor pattern region or a distance between the center of the conductor pattern region and a predetermined point so as to identify the cover device 302.

The method of the disclosure may further include: recognizing a magnetic body attached to the mounted cover device 302; and identifying the cover device 302 on the basis of the conductor pattern when the magnetic body is recognized.

The method of the disclosure may further include: recognizing at least one of a position, magnitude, intensity, or polarity distribution of a magnetic body 329 attached to the mounted cover device 302; and identifying the cover device 302 on the basis of at least one of the recognized items.

The method of the disclosure may further include: activating the wireless communication circuit 192 when the rear cover 301 is mounted on the electronic device 101; determining, when a first identifier of the rear cover 301 is received from the rear cover 301 via the activated wireless communication circuit 192, whether the received first identifier is the same as the previously stored second identifier in the memory 130; requesting information on at least one cover device 302 corresponding to the first identifier when the first identifier is not the same as the second identifier; and storing information on the at least one cover device 302, which is received in response to the request.

The method of the disclosure may further include: configuring a screen of the touch screen display (e.g., the display device 160) to correspond to the identified cover device 302; and displaying the configured screen on the touch screen display (e.g., the display device 160).

The method of the disclosure may further include: identifying the cover device 301 mounted on the touch screen display (e.g., the display device 160) on the basis of the first identifier when the first identifier and the second identifier are the same.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing;
   a memory;
   a wireless communication circuit disposed within the housing;
   a touch screen display exposed to an exterior of the housing; and
   a processor disposed within the housing and electrically connected to the wireless communication circuit and the touch screen display,
   wherein the processor is configured to:
   sense a rear cover of a cover device mounted on the electronic device,
   receive a first identifier from the rear cover, in response to identifying that the first identifier does not match any of one or more identifiers stored in the memory, display a message on the touch screen display, sense a front cover of the cover device mounted on the touch screen display, identify a conductor pattern of a plurality of conductor pads in the mounted front cover by scanning the touch screen display on which the front cover is mounted, identify an area specified by an outer boundary of the conductor pattern as a conductor pattern region, identify a distance from a center point of the conductor pattern region to a predetermined point on the touch screen display, and identify the mounted front cover based on the identified distance.

2. The electronic device of claim 1, wherein the processor is further configured to:

recognize a magnetic body attached to the mounted front cover, and identify the front cover based on the conductor pattern when the magnetic body is recognized.

3. The electronic device of claim 2, wherein the processor is further configured to:

recognize at least one of a position, a size, an intensity, or a polarity distribution of the magnetic body, and identify the front cover based on the recognition of the at least one of the position, the size, the intensity, or the polarity distribution.

4. The electronic device of claim 1, wherein the processor is further configured to:

configure and display a screen of the touch screen display to correspond to the identified front cover.

5. The electronic device of claim 1, wherein the processor is further configured to:

determine, when a first identifier of the rear cover is received via the wireless communication circuit from the rear cover, whether the first identifier and a previously stored second identifier are the same, request information of at least one cover device corresponding to the first identifier when the first identifier and the second identifier are not the same, and receive the information of the at least one cover device.

6. The electronic device of claim 5, wherein the information of the cover device comprises information of at least one of a shape or a region of the conductor pattern, or a position, a size, an intensity, or a polarity distribution of a magnetic body attached to the at least one cover device.

7. The electronic device of claim 5, wherein the processor is further configured to identify the front cover mounted on the touch screen display after identifying that the first identifier and the second identifier are the same.

8. A method of identifying a cover device attached to an electronic device, the method comprising:

sensing mounting of a rear cover of the cover device on the electronic device;

activating a wireless communication circuit in response to sensing the mounting of the rear cover on the electronic device;

receiving, through the wireless communication circuit, a first identifier of the rear cover from the rear cover;

in response to identifying that the first identifier does not match any of one or more identifiers stored in a memory of the electronic device, displaying a message;

sensing mounting of a front cover of the cover device on a touch screen display of the electronic device;

identifying a conductor pattern of a plurality of conductor pads in the mounted front cover by scanning the touch screen display on which the front cover is mounted;

identifying an area specified by an outer boundary of the conductor pattern as a conductor pattern region;

identifying a distance from a center point of the conductor pattern region to a predetermined point on the touch screen display; and identifying the mounted front cover based on the identified distance.

9. The method of claim 8, further comprising:

recognizing a magnetic body attached to the front cover; and identifying the front cover based on the conductor pattern when the magnetic body is recognized.

10. The method of claim 8, further comprising:

recognizing at least one of a position, a size, an intensity, or a polarity distribution of a magnetic body attached to the mounted front cover; and identifying the front cover based on the recognition of the at least one of the position, the size, the intensity, or the polarity distribution.

11. The method of claim 8, further comprising:

determining, when a first identifier of the rear cover is received via the activated wireless communication circuit from the rear cover, whether the first identifier and a second identifier previously stored in a memory are the same;

requesting information of at least one cover device corresponding to the first identifier when the first identifier and the second identifier are not the same; and receiving the information of the at least one cover device.

12. The method of claim 11, further comprising:

identifying the front cover mounted on the touch screen display on the basis of the first identifier after identifying that the first identifier and the second identifier are the same.

13. The method of claim 8, further comprising:

configuring a screen of the touch screen display which is sized based on the front cover; and displaying the configured screen on the touch screen display.

* * * * *